United States Patent
Iwase et al.

(10) Patent No.: US 7,411,336 B2
(45) Date of Patent: Aug. 12, 2008

(54) HOLLOW LAMINATED PIEZOELECTRIC ELEMENT AND ITS MANUFACTURING METHOD

(75) Inventors: Akio Iwase, Nishio (JP); Shige Kadotani, Chita-gun (JP); Tetsuji Itou, Kariya (JP)

(73) Assignee: Denso Corporation, Kariya (JP)

( * ) Notice: Subject to any disclaimer, the term of this patent is extended or adjusted under 35 U.S.C. 154(b) by 338 days.

(21) Appl. No.: 11/294,690

(22) Filed: Dec. 5, 2005

(65) Prior Publication Data

US 2006/0119220 A1    Jun. 8, 2006

(30) Foreign Application Priority Data

Dec. 6, 2004    (JP) .............................. 2004-353164

(51) Int. Cl.
*H01L 41/08* (2006.01)
(52) U.S. Cl. ..................................... 310/328
(58) Field of Classification Search ................ 310/328, 310/364, 365, 366, 368; 239/97, 96
See application file for complete search history.

(56) References Cited

U.S. PATENT DOCUMENTS

| | | | |
|---|---|---|---|
| 5,254,212 A * | 10/1993 | Someji et al. ............... | 310/366 |
| 5,568,679 A * | 10/1996 | Ohya et al. ................. | 310/366 |
| 6,478,013 B1 | 11/2002 | Boecking | |
| 7,288,875 B2 * | 10/2007 | Kadotani et al. ............ | 310/328 |
| 7,309,945 B2 * | 12/2007 | Iwase et al. ................. | 310/328 |

FOREIGN PATENT DOCUMENTS

| | | |
|---|---|---|
| JP | 62-045971 | 2/1987 |
| JP | 02-112663 | 4/1990 |
| JP | 7-176802 | 7/1995 |
| JP | 08-200180 | 8/1996 |
| JP | 09-310654 | 12/1997 |
| JP | 09-329068 | 12/1997 |
| JP | 10-009084 | 1/1998 |
| JP | 2002-252381 | 9/2002 |

* cited by examiner

*Primary Examiner*—Darren Schuberg
*Assistant Examiner*—Karen B Addison
(74) *Attorney, Agent, or Firm*—Harness, Dickey & Pierce, PLC

(57) ABSTRACT

A hollow laminated piezoelectric element having excellent durability and reliability and capable of obtaining a high output, and a method of manufacturing the hollow laminated piezoelectric element are provided. A hollow laminated piezoelectric element 1 comprises a ceramic laminate 10 that is formed by having alternately laminated piezoelectric layers 11 made of a piezoelectric material and internal electrode layers 21 and 22 having conductivity and by having a center through hole 14 formed to pass through the ceramic laminate 10 along a lamination direction. The ceramic laminate 10 has an internally terminated structure in the inside periphery having at least a portion of inside peripheral ends of the internal electrode layers 21 and 22 terminated within the ceramic laminate 10 so that at least a portion of the inside peripheral ends of the internal electrode layers 21 and 22 is not exposed to the inside peripheral surface 104 of the ceramic laminate 10. The inside peripheral surface 104 of the ceramic laminate 10 has inside peripheral slits 13 having trenches provided in the peripheral direction toward the inside of the piezoelectric layers 11 from the inside peripheral surface 104.

8 Claims, 18 Drawing Sheets

HOLLOW LAMINATED PIEZOELECTRIC ELEMENT AND ITS MANUFACTURING METHOD

This application is a new U.S. patent application that claims benefit of JP 2004-353164, filed Dec. 6, 2004, the entire contents of each of which are hereby incorporated by reference.

FIELD OF THE INVENTION

The present invention relates to a hollow laminated piezoelectric element that is applied to a piezoelectric actuator or the like, and a method of manufacturing the hollow laminated piezoelectric element.

BACKGROUND OF THE INVENTION

In recent years, from the viewpoint of environmental concerns, fuel consumption, and the exhaust gas of automobiles, development of fuel injectors for automobiles using a laminated piezoelectric element is progressing.

The laminated piezoelectric element usually contains a ceramic laminate that is formed by having alternately laminated piezoelectric layers made of a piezoelectric material and internal electrode layers having conductivity. A voltage is applied to between internal electrodes, thereby generating a displacement in the piezoelectric layers for driving.

Laminated piezoelectric elements can have various shapes. For example, there is a hollow laminated piezoelectric element that has a ceramic laminate having a through hole provided in a lamination direction.

Examples of the hollow laminated piezoelectric element that is used as a piezoelectric actuator for a fuel injector of an automobile are described in JP-A-10-9084 and JP-A-2002-252381.

However, the hollow laminated piezoelectric element has a through hole provided in the ceramic laminate. Therefore, it is difficult to insulate the internal peripheral surface of the ceramic laminate, and sufficient reliability cannot be obtained.

In order to solve the above problem, a method of insulating the internal peripheral surface of the ceramic laminate of the hollow laminated piezoelectric element by forming an insulator on the internal peripheral surface using electrophoresis is proposed in JP-A-7-176802 and JP-A-9-329068.

However, according to the above insulation method, the adhesive strength of the insulator is not sufficient, and stress generated by piezoelectric displacement is repetitively applied, thereby causing peeling-off of the insulator. Consequently, moisture enters the internal peripheral surface, and causes an insulation failure.

In addition to the above method, there is also a method of securing insulation on the internal peripheral surface of the ceramic laminate by employing a partial electrode structure in the hollow laminated piezoelectric element.

The laminated piezoelectric element includes a whole surface electrode structure type in which the ends of the internal electrode layers are exposed on all side surfaces of the ceramic laminate, and a partial electrode structure type (or an internally terminated structure) in which a portion of the ends of the internal electrode layers is terminated within the body of the ceramic laminate. According to the whole surface electrode structure type, the ends of the internal electrode layers are exposed on all side surfaces of the ceramic laminate. Therefore, there are many non-insulation parts, and it becomes difficult to insulate these parts. On the other hand, according to the partial electrode structure type, the ends of the internal electrode layers are terminated within the body of the ceramic laminate, and insulation can be secured.

However, in the case of the partial electrode structure type, stress generated due to piezoelectric displacement is concentrated at the ends of the internal electrode layers, and this has a risk of the occurrence of cracks. This inconvenience becomes extreme when a high output is produced. Therefore, it is difficult to obtain sufficient durability and reliability of the piezoelectric actuator for a long-term use as well as to obtain a high output.

As explained above, according to the conventional hollow laminated piezoelectric element, it is not easy to secure insulation, obtain sufficient durability and reliability, and obtain a high output.

SUMMARY OF THE INVENTION

The present invention has been made in the light of the above conventional problems, and provides a hollow laminated piezoelectric element having excellent durability and reliability and the capable of obtaining a high output, and a method of manufacturing the hollow laminated piezoelectric element.

A first invention provides a hollow laminated piezoelectric element that comprises a ceramic laminate formed by having alternately laminated piezoelectric layers made of a piezoelectric material and internal electrode layers having conductivity and by having a center through hole formed to pass through the ceramic laminate along a lamination direction, wherein the ceramic laminate has an internally terminated structure in the inside periphery having at least a portion of the inside peripheral ends of the internal electrode layers terminated within the ceramic laminate so that at least a portion of the inside peripheral ends of the internal electrode layers is not exposed to the inside peripheral surface of the ceramic laminate, and the inside peripheral surface of the ceramic laminate has inside peripheral slits having trenches provided in the peripheral direction toward the inside of the piezoelectric layers from the inside peripheral surface.

In the hollow laminated piezoelectric element according to the present invention, the ceramic laminate has an internally terminated structure in the inside periphery having at least a portion of inside peripheral ends of the internal electrode layers terminated within the ceramic laminate.

In other words, because the inside peripheral ends of the internal electrode layers are terminated within the ceramic laminate, electrical insulation of the inside peripheral surface of the ceramic laminate can be secured. Therefore, insulation can be secured easily at the inside peripheral ends at which it has been difficult to secure insulation.

The inside peripheral surface of the ceramic laminate has inside peripheral slits having trenches provided in the peripheral direction toward the inside of the piezoelectric layers from the inside peripheral surface.

In other words, because the ceramic laminate has the inside peripheral slits, stress generated due to piezoelectric displacement can be relaxed. Therefore, the ceramic laminate can suppress cracks that occur in the piezoelectric layers, and can improve durability. Consequently, sufficient durability can be exhibited and high reliability can be obtained even when the piezoelectric actuator is driven to obtain a higher output than a conventional output level.

As explained above, the ceramic laminate can sufficiently secure electric insulation and can provide high durability and reliability. The hollow laminated piezoelectric element having this ceramic laminate achieves high performance capable of obtaining a high output.

As explained above, according to the present invention, it is possible to provide a hollow laminated piezoelectric element having excellent durability and reliability and capable of obtaining a high output.

A second invention provides a method of manufacturing the hollow laminated piezoelectric element according to claim 1, the method including:

a sheet forming step of forming a green sheet for forming the piezoelectric layer in the ceramic laminate;

an electrode material disposing step of disposing an electrode material for forming the internal electrode layers in a ring shape having a hole in the center, on the green sheet;

a vanishing slit layer forming step of forming a vanishing slit layer that vanishes when a sintering is carried out subsequently, on the green sheet;

a spacer layer forming step of forming spacer layers on at least a part of the inner periphery side and the outer periphery side of the electrode material and the vanishing slit layer on the green sheet;

an adhesive layer forming step of forming an adhesive layer on the electrode material and the spacer layer;

a punching step of punching the green sheet to obtain a electrode material-containing piece comprising the sequentially laminated green sheet, electrode material, spacer layer and adhesive layer and having a through hole in the center, and a vanishing slit layer-containing piece comprising the sequentially laminated green sheet, vanishing slit layer and spacer layer and having a through hole in the center;

a laminating step of forming an intermediate laminate by alternately laminating the electrode material-containing piece and the vanishing slit layer-containing piece by arranging the through holes; and a sintering step of sintering the intermediate laminate to remove the vanishing slit layer.

In the method of manufacturing the hollow laminated piezoelectric element according to the present invention, at the spacer layer forming step, the spacer layer is formed on at least a part of the inner periphery side and the outer periphery side of the electrode material on the green sheet.

In other words, by forming the spacer layer, the inside peripheral ends and the outside peripheral ends of the internal electrode layers formed by the electrode material can be terminated within the ceramic laminate without carrying out a step of strongly pressing in the laminate state. Therefore, the ceramic laminate obtained can easily secure electric insulation.

At the vanishing slit layer forming step, the vanishing slit layer is formed on the green sheet. At the sintering step, the vanishing slit layer is removed by sintering.

In other words, by forming the vanishing slit layer, slits for relaxing stress generated due to piezoelectric displacement can be formed on the part of the green sheet where the vanishing slit layer is removed by sintering. Because the obtained ceramic laminate has the slits, cracks that occur in the piezoelectric layer can be suppressed, and durability can be improved. Consequently, sufficient durability can be exhibited and high reliability can be obtained even when the piezoelectric actuator is driven to obtain an output higher than a conventional output level.

As explained above, the ceramic laminate can sufficiently secure electric insulation and can obtain high durability and reliability. The hollow laminated piezoelectric element manufactured by using this ceramic laminate achieves high performance capable of obtaining a high output.

As explained above, according to the present invention, it is possible to provide a method of manufacturing a hollow laminated piezoelectric element having excellent durability and reliability and capable of obtaining a high output.

DESCRIPTION OF THE PREFERRED EMBODIMENTS

Figure 1:
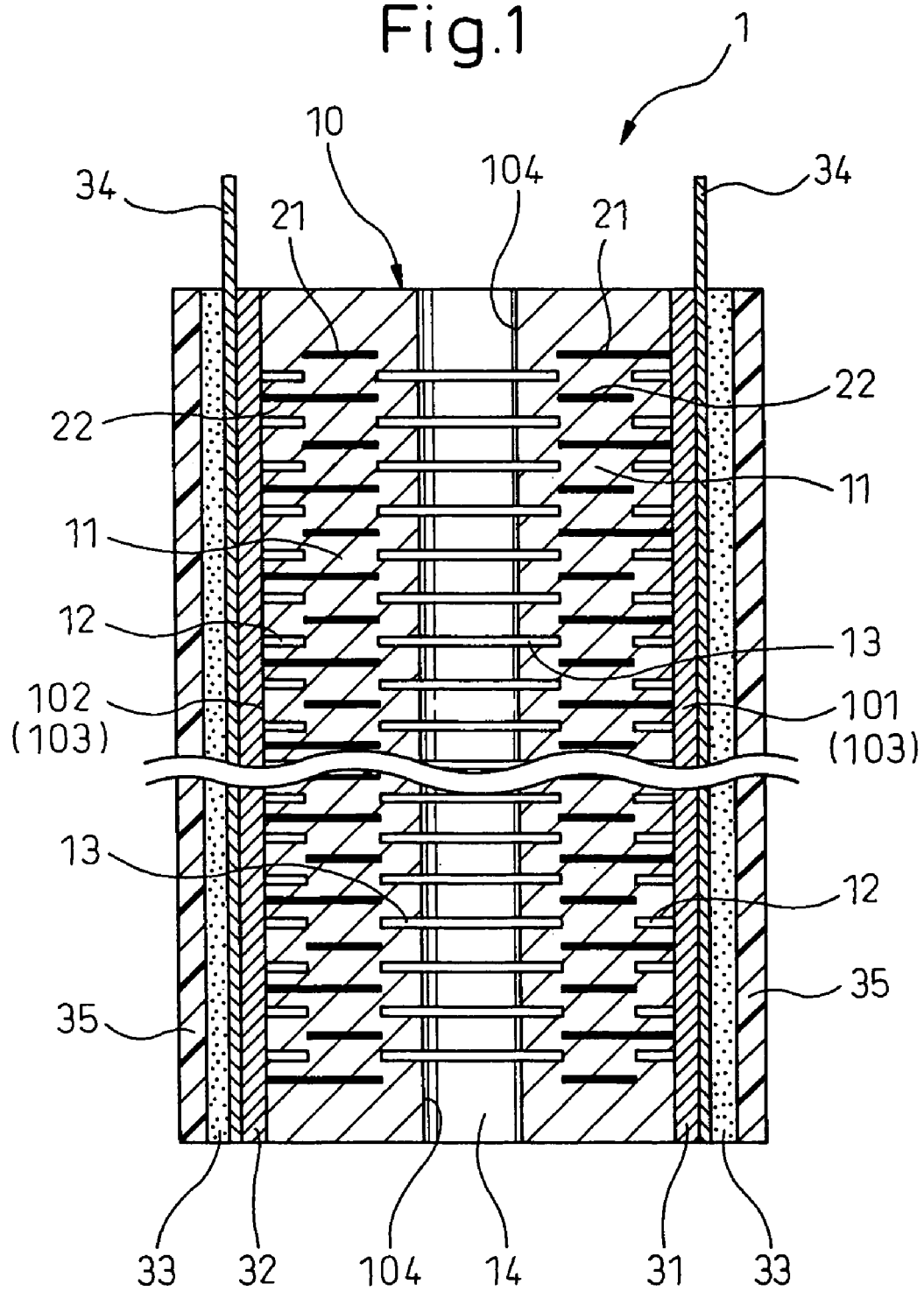
FIG. 1 is an explanatory diagram of a configuration of a hollow laminated piezoelectric element according to example 1.

In the first embodiment, the inside peripheral slits preferably have a ring shape extending in the whole peripheral directions.

In this case, the inside peripheral slits can sufficiently relax stress generated due to piezoelectric displacement and can further suppress the occurrence of cracks.

Preferably, the ceramic laminate has an internally terminated structure in the outside periphery having at least a portion of outside peripheral ends of the internal electrode layers terminated within the ceramic laminate so that at least a portion of the outside peripheral ends of the internal electrode layers is not exposed to the outside peripheral surface of the ceramic laminate, and the outside peripheral surface of the ceramic laminate has outside peripheral slits having trenches provided in the peripheral direction toward the inside of the piezoelectric layers from the outside peripheral surface.

In this case, because the ceramic laminate has an internally terminated structure in the outside periphery, electric insulation can be secured on the outside peripheral surface of the ceramic laminate. The ceramic laminate has slits on both the inside peripheral surface and the outside peripheral surface. Therefore, in the whole ceramic laminate, the peripheral slits can sufficiently relax stress generated due to piezoelectric displacement and can further suppress the occurrence of cracks.

Preferably, the outside peripheral slits have a ring shape extending in the whole peripheral directions.

In this case, the outside peripheral slits can more sufficiently relax stress generated due to piezoelectric displacement and can further suppress the occurrence of cracks.

Preferably, the ceramic laminate has an entirely internally terminated structure in the inside periphery having all of the inside peripheral ends of the internal electrode layers terminated within the ceramic laminate so that all of the inside peripheral ends of the internal electrode layers are not exposed to the inside peripheral surface of the ceramic laminate.

In this case, because the ceramic laminate has the entirely internally terminated structure in the inside periphery, electric insulation can be secured easily on the entire inside peripheral surface of the ceramic laminate.

Preferably, a pair of side electrodes that are electrically connected to the internal electrode layers are disposed on the outside peripheral surface of the ceramic laminate.

In this case, the electric conductivity of the internal electrode layers can be secured easily via the side electrodes on the outside peripheral surface of the ceramic laminate.

The ceramic laminate can have a part of the internal electrode layers exposed to the inside peripheral surface, and have a pair of side electrodes, that are electrically connected to the internal electrode layers disposed on the inside peripheral surface of the ceramic laminate.

In this case, electric conductivity of the internal electrode layers can be secured easily via the side electrodes on the inside peripheral surface of the ceramic laminate.

The ceramic laminate can also have an entirely internally terminated structure in the outside periphery having all of the outside peripheral ends of the internal electrode layers terminated within the ceramic laminate so that all of the outside peripheral ends of the internal electrode layers are not exposed to the outside peripheral surface of the ceramic laminate.

In this case, because the ceramic laminate has the entirely internally terminated structure in the outside periphery, electric insulation can be secured on the entire outside peripheral surface of the ceramic laminate.

Preferably, the laminated piezoelectric element is a piezoelectric actuator for an injector that is used for a driving source of an injector.

The injector is used in severe conditions under a high temperature environment. Therefore, when the above-mentioned excellent hollow laminated piezoelectric element is used as an actuator, durability and reliability can be improved, and the total performance of the injector can be improved.

In the second embodiment, at the adhesive layer forming step, an adhesive layer is formed on the electrode material and the spacer layer, and on the vanishing slit layer and the spacer layer, and at the punching step, the green sheet is punched to obtain an electrode material-containing piece comprising the sequentially laminated green sheet, electrode material, spacer layer, and adhesive layer and having a through hole in the center, and a vanishing slit layer-containing piece comprising the sequentially laminated green sheet, vanishing slit layer, spacer layer, and adhesive layer and having a through hole in the center.

In this case, the adhesive layer is formed on both the electrode material-containing piece and the vanishing slit layer-containing piece obtained at the punching step. Therefore, both can be laminated easily at the subsequent laminating step.

A material that can secure electric insulation is used for the spacer layer and the adhesive layer in the second embodiment. Specifically, the material same as that of the piezoelectric layer can be preferably used.

Preferably, the spacer layer is printed in approximately the same thickness as that of the electrode material and the vanishing slit layer. In this case, the electrode material-containing piece and the vanishing slit layer-containing piece can be laminated in high precision.

EXAMPLES

Example 1

A hollow laminated piezoelectric element and a method of manufacturing the hollow laminated piezoelectric element according to embodiments of the present invention are explained with reference to FIG. 1 to FIG. 11.

As shown in FIG. 1, a hollow laminated piezoelectric element 1 according to the present embodiment comprises a ceramic laminate 10 that is formed by having alternately laminated piezoelectric layers 11 made of a piezoelectric material and internal electrode layers 21 and 22 having conductivity and by having a center through hole 14 provided to pass through the ceramic laminate 10 along a lamination direction.

The ceramic laminate 10 has an internally terminated structure in the inside periphery having at least a portion of inside peripheral ends of the internal electrode layers 21 and 22 terminated within the ceramic laminate 10 so that at least a portion of the inside peripheral ends of the internal electrode layers 21 and 22 is not exposed to the inside peripheral surface 104 of the ceramic laminate 10.

The inside peripheral surface 104 of the ceramic laminate 10 has inside peripheral slits 13 having trenches provided in the peripheral direction toward the inside of the piezoelectric layers 11 from the inside peripheral surface 104.

This is explained in further detail below.

Figure 2:
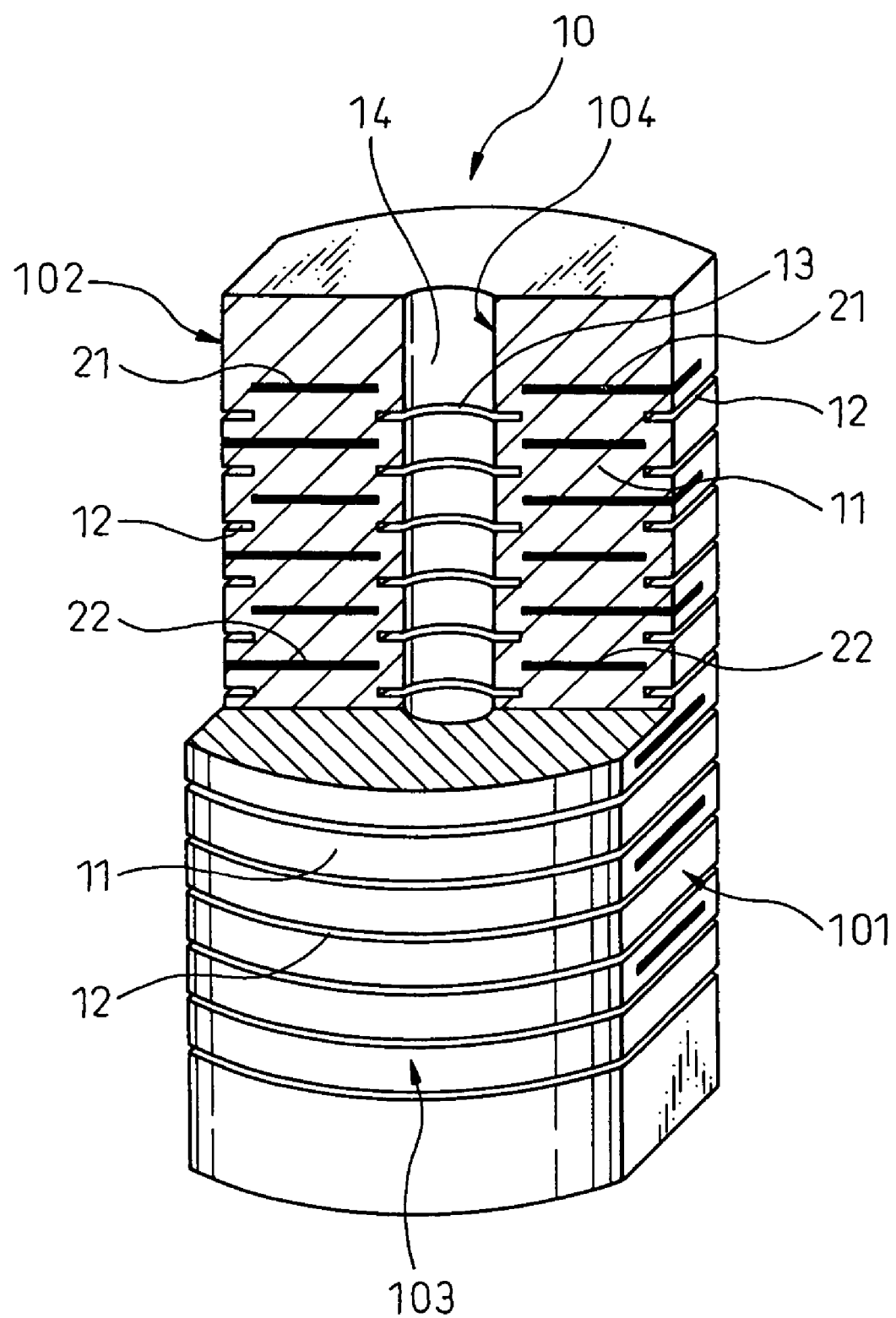
FIG. 2 is an explanatory diagram of a configuration of a ceramic laminate according to example 1.

As shown in FIG. 2, in the hollow laminated piezoelectric element 1, the ceramic laminate 10 has a barrel-shaped cross section having a pair of mutually opposite side surfaces 101 and 102 formed on the outside peripheral surface 103 of an approximately pillar-shaped laminate. The cross-sectional shape of the ceramic laminate 10 is not limited to this barrel shape, and can have various shapes such as a circular shape, a square shape, and an octagon shape, depending on a usage.

As shown in FIG. 1 and FIG. 2, the ceramic laminate 10 has the entirely internally terminated structure in the inside periphery having all of the inside peripheral ends of the internal electrode layers 21 and 22 terminated within the ceramic laminate 10 without being exposed to the inside peripheral surface 104.

The ceramic laminate 10 also has an internally terminated structure in the outside periphery having a part of outside peripheral ends of the internal electrode layers 21 and 22 terminated within the ceramic laminate 10 without being exposed to the outside peripheral surface 103. In other words, in the present embodiment, on the side surface 101 of the ceramic laminate 10, the outside peripheral ends of the first internal electrode layers 21 are exposed, and the outside peripheral ends of the second internal electrode layers 22 are not exposed and are terminated within the ceramic laminate 10. On the other hand, on the side surface 102 of the ceramic laminate 10, the outside peripheral ends of the second internal electrode layers 22 are exposed, and the outside peripheral ends of the first internal electrode layers 21 are not exposed and are terminated within the ceramic laminate 10.

Further, as shown in FIG. 1 and FIG. 2, the inside peripheral surface 104 of the ceramic laminate 10 has inside peripheral slits 13 having trenches provided in the peripheral direction toward the inside of the piezoelectric layers 11 from the inside peripheral surface 104. On the other hand, the outside peripheral surface 103 of the ceramic laminate 10 has outside peripheral slits 12 having trenches provided in the peripheral direction toward the inside of the piezoelectric layers 11 from the outside peripheral surface 103.

The inside peripheral slits 13 and the outside peripheral slits 12 are provided at an intermediate part in the lamination direction of all the adjacent internal electrode layers 21 and 22, and have a ring shape extending in the whole peripheral directions. In the present embodiment, the inside peripheral slits 13 and the outside peripheral slits 12 are formed in a thickness of 5 μm in the piezoelectric layers 11 having a thickness of 160 μm.

As shown in FIG. 1, side electrodes 31 and 32 are provided on the side surfaces 101 and 102 respectively of the ceramic laminate 10. The side electrodes 31 and 32 are electrically connected to the first internal electrode layers 21 and the second internal electrode layers 22 respectively. Fetch electrodes 34 are connected to the side surface electrodes 31 and 32 via a conductive adhesive 33. Alternatively, the fetch electrodes 34 can be provided on only the upper part of the side surfaces 101 and 102 of the ceramic laminate 10 respectively. Alternatively, the fetch electrodes 34 can be connected to the side surfaces 101 and 102 of the ceramic laminate 10 respectively via the conductive adhesive 33 without providing the side surface electrodes 31 and 32.

As shown in FIG. 1, the outside peripheral surface 103 of the ceramic laminate 10 is molded with a molding material 35 made of an insulating resin over the whole periphery.

A method of manufacturing the hollow laminated piezoelectric element 1 is explained next.

The method of manufacturing the hollow laminated piezoelectric element 1 according to the present embodiment includes a sheet forming step, an electrode material disposing step, a vanishing slit layer forming step, a spacer layer forming step, an adhesive layer forming step, a punching step, a laminating step, and a sintering step.

At the sheet forming step, a green sheet 110 for forming the piezoelectric layers 11 is formed on the ceramic laminate 10.

At the electrode material disposing step, an electrode material 200 for forming the internal electrode layers 21 and 22 is provided in a ring shape having a hole in the center, on the green sheet 110.

At the vanishing slit layer forming step, a vanishing slit layer 120, that is removed when a sintering is carried out subsequently, is formed on the green sheet 110.

At the spacer layer forming step, spacer layers 111 are formed on at least a part of the inner periphery side and the outer periphery side of the electrode material 200 and the vanishing slit layer 200 on the green sheet 110.

At the adhesive layer forming step, an adhesive layer is formed on the electrode material 200 and the spacer layer 111.

At the punching step, the green sheet 110 is punched to obtain an electrode material-containing piece 51 comprising the sequentially laminated green sheet 110, electrode material 200, spacer layer 111 and adhesive layer 112 and having a through hole 500 in the center, and a vanishing slit layer-containing piece 52 comprising the sequentially laminated green sheet 110, vanishing slit layer 120 and spacer layer 111, and having the through hole 500 in the center.

At the laminating step, an intermediate laminate 100 is formed by alternately laminating the electrode material-containing piece 51 and the vanishing slit layer-containing piece 52 with arranging the through holes 500.

At the sintering step, the intermediate laminate 100 is sintered to vanish the vanishing slit layer 120.

This is explained in detail below.

Sheet Forming Step

Figure 3:
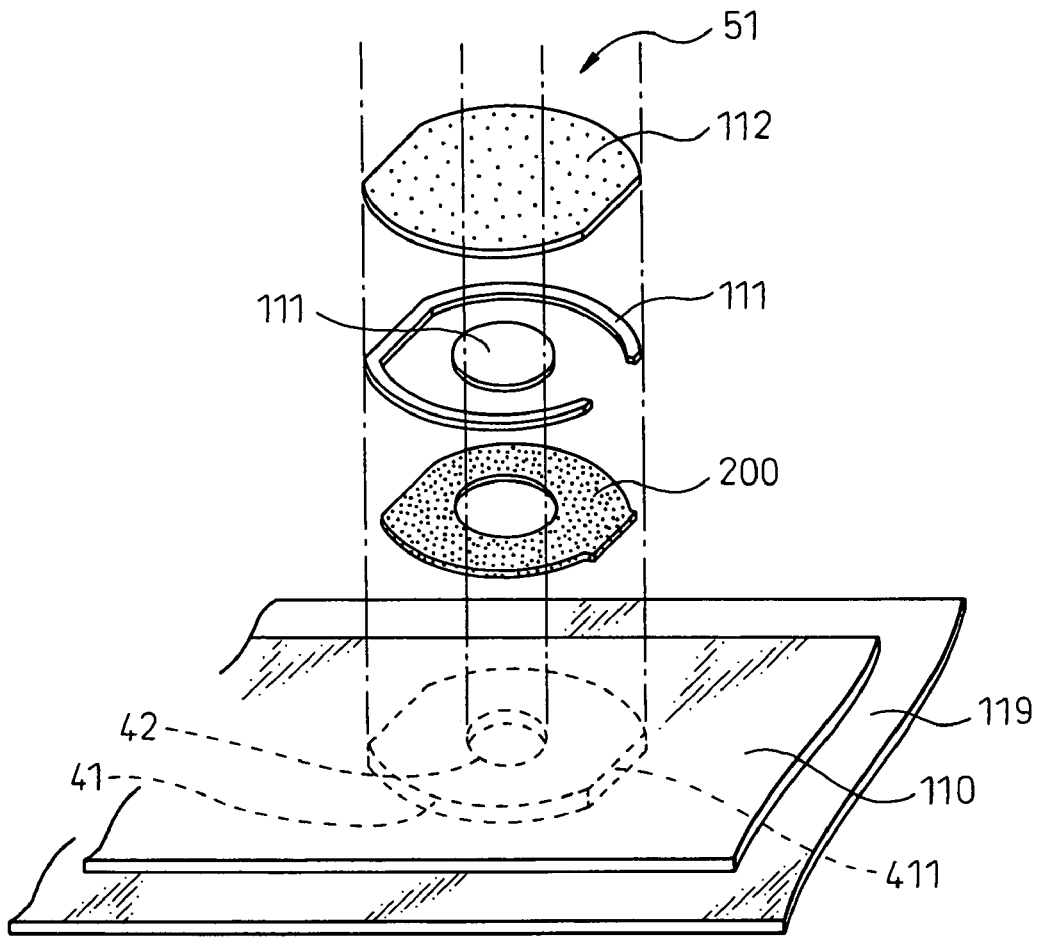
FIG. 3 is an explanatory diagram of a printing of an electrode material-containing piece according to example 1.
Figure 5:
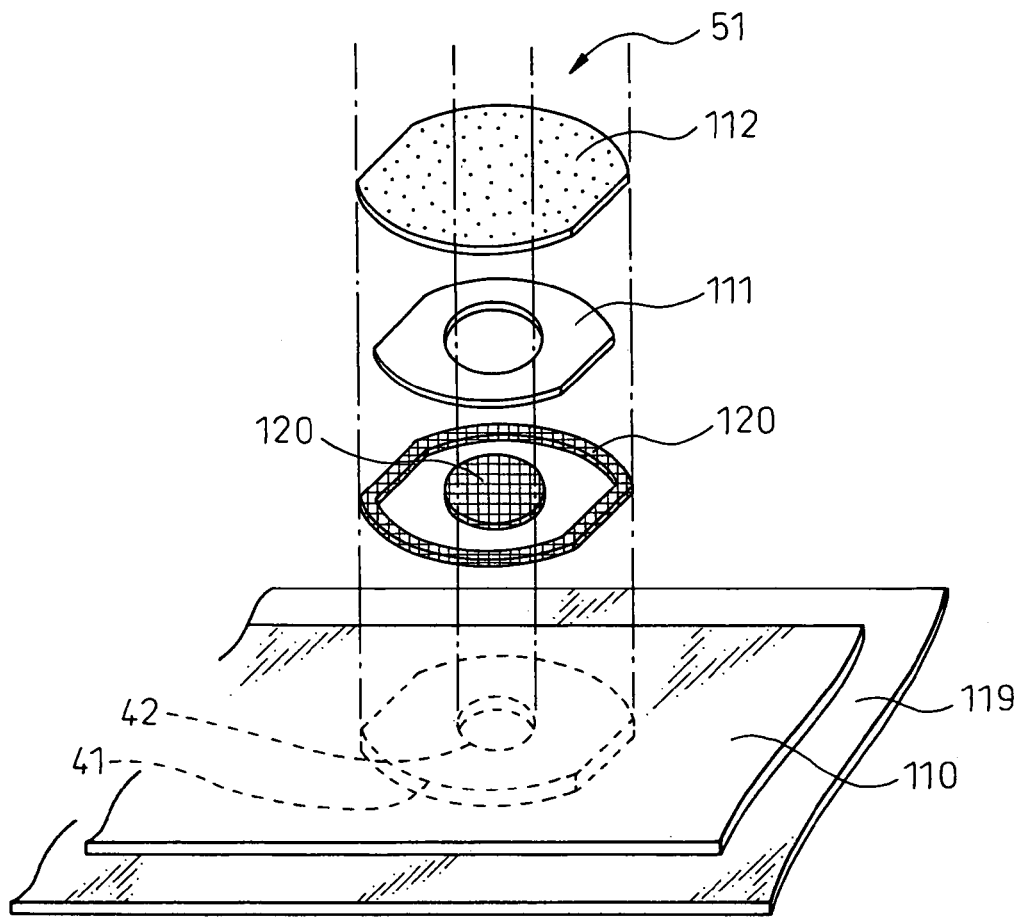
FIG. 5 is an explanatory diagram of a printing of a vanishing slit layer-containing piece according to example 1.

First, a ceramic raw material power such as lead zirconate titanate (PZT) is prepared, and this is calcined at 800 to 950° C. Next, pure water and a dispersant are added to the calcined powder to prepare a slurried material. This slurried material is wet-milled with a pearl mill. This milled material is dried, and is degreased, and is then added with a solvent, a binder, a plasticizer, and a dispersant. The result is mixed with a ball mill. A slurry obtained as a result of the mixture is stirred with a stirrer in a vacuum device, thereby defoaming the slurry in vacuum and adjusting viscosity. The slurry is coated onto a carrier film 119 based on the doctor blade method, thereby forming the green sheet 110 in a thickness of 90 μm (FIG. 3 and FIG. 5).

In addition to the doctor blade method used in the present embodiment, an extrusion method and various other methods can be also used to form the green sheet 110.

Electrode Material Disposing Step, Vanishing Slit Layer Forming Step, Spacer Layer Forming Step, and Adhesive Layer Forming Step Next, various kinds of materials are printed onto the formed green sheet 110, in order to obtain two kinds of sheets of the electrode material-containing piece 51 as a sheet containing the electrode material 200 and the vanishing slit layer-containing piece 52 as a sheet containing the vanishing slit layer 120, that are necessary to manufacture the ceramic laminate 10 (FIG. 2).

In FIG. 3 to FIG. 6, it is shown that printing is carried out in a barrel-shaped punching area 41. However, in actual practice, a circular printing is carried out in an area slightly larger than the punching area 41.

Figure 4:
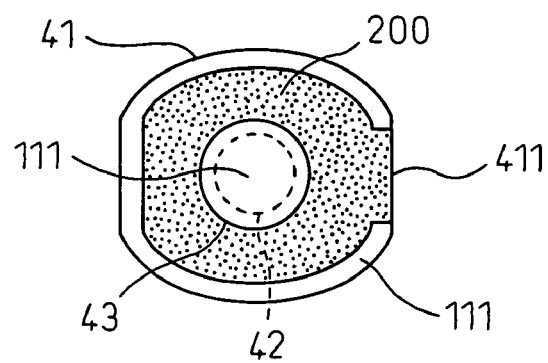
FIG. 4 is an explanatory diagram of printing positions of an electrode material and a spacer layer according to example 1.

First, as shown in FIGS. 3 and 4, for the electrode material-containing piece 51, the electrode material 200 for forming the inside electrode layers 21 and 22 is printed on the inside periphery of the punching area 41 excluding a center 43 including a center through-hole area 42 and the outside periphery formed by one straight-line part 411 of the punching area 41 (i.e., the electrode material disposing step). A part of the center 43 except for the center through-hole area 42 becomes the area where the inside peripheral ends of the internal electrode layers 21 and 22 are terminated within the ceramic laminate 10.

In the punching area 41, in order to make the height of the printed part of the electrode material 200 approximately the same as the height of other printed part, the spacer layer 111 made of the slurry is printed on the part where the electrode material 200 is not printed, at the same thickness as that of the electrode material 200 (i.e., the spacer layer forming step). By forming the spacer layer 111, sheet pieces can be laminated in high precision at the laminating step described later, and the laminated pieces are not required to be pressed strongly.

Further, in order to increase the adhesion effect at the time of laminating the sheet pieces, the adhesive layer 112 made of the slurry is printed on the electrode material 200 and the spacer layer 111 (i.e., the adhesive layer forming step).

In FIG. 4, printing positions of the electrode material 200 and the spacer layer 111 are shown.

Next, for the vanishing slit layer-containing piece 52, the vanishing slit layer 120 made of a vanishing material that vanishes at the subsequent vanishing step is printed on both the outside periphery of the punching area 41 and the center 44 including the center through-hole area 42 (i.e., the vanishing slit layer forming step). The part of the center 44 except for the center through-hole area 42 becomes the area where the inside slit 13 is formed.

In the punching area 41, the spacer layer 111 made of the slurry is printed on the part where the vanishing slit layer 120 is not printed, in the same thickness as that of the vanishing slit layer 120 (i.e., the spacer layer forming step).

Further, the adhesive layer 112 made of the slurry is printed on the vanishing slit layer 120 and the spacer layer 111 (i.e., the adhesive layer forming step).

In the present embodiment, while the adhesive layer 112 is printed on the vanishing slit layer 120 and the spacer layer 111, the adhesive layer 112 does not have to be printed. In this case, the spacer layer 111 made of the slurry that is the same material as that of the adhesive layer 112 can play the role of the adhesive layer 112.

Figure 6:
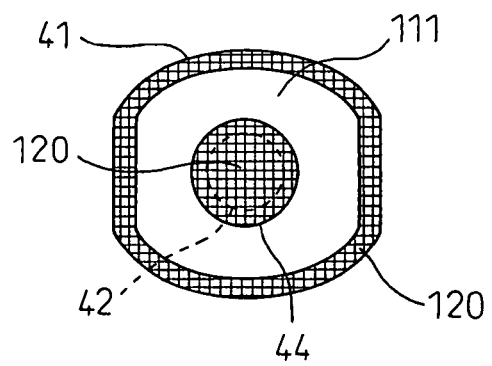
FIG. 6 is an explanatory diagram of printing positions of a vanishing slit layer and a spacer layer according to example 1.

In FIG. 6, printing positions of the vanishing slit layer 120 and the spacer layer 111 are shown.

Figure 7:
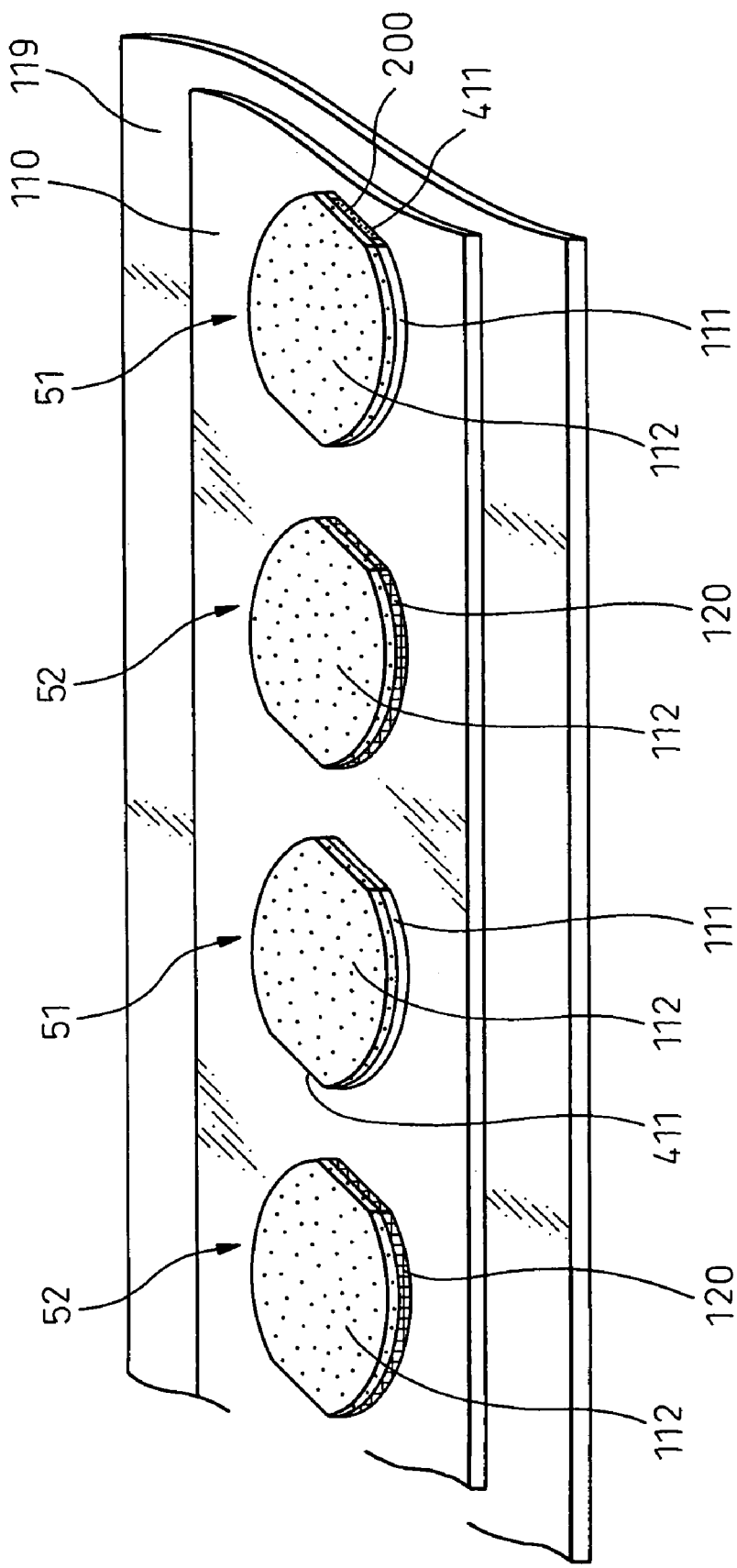
FIG. 7 is an explanatory diagram of a green sheet on which an electrode material-containing piece and a vanishing slit layer-containing piece are printed according to example 1.

In the present embodiment, the inside peripheral slits 13 and the outside peripheral slits 12 are provided at the intermediate of in the lamination direction of all the adjacent internal electrode layers 21 and 22 (FIG. 2). For this purpose, the electrode material-containing pieces 51 and the vanishing slit layer-containing pieces 52 are printed alternately on the green sheet 110 formed in a belt shape, as shown in FIG. 7.

The electrode material-containing pieces 51 are printed in such a way that the straight-line part 411 of the punching area 41 printed with the electrode material 200 faces alternately opposite directions.

In the present embodiment, an Ag/Pd alloy in a paste shape is used for the electrode material 200. In addition to the above, a simple substance of Ag, Pd, Cu, and Ni, and an alloy of Cu/Ni or the like can be also used.

For the vanishing material that constitutes the vanishing slit layer 120, a material made of carbon particles with small thermal deformation and capable of maintaining high shape precision of the inside peripheral slits 13 and the outside peripheral slits 12 that are formed at the subsequent sintering step is used. In addition to the above, powdery organic carbon particles obtained by carbonation can be also used. The organic carbon particles can be obtained by carbonating the powdery organic particles. In addition to this, organic carbon particles can be obtained by crushing the carbonated organics. For the organics, polymer materials such as resins, and cereals such as corns, soy beans, and wheat flour can be also used. In this case, the manufacturing cost can be minimized.

Punching step, and Laminating Step

Figure 8:
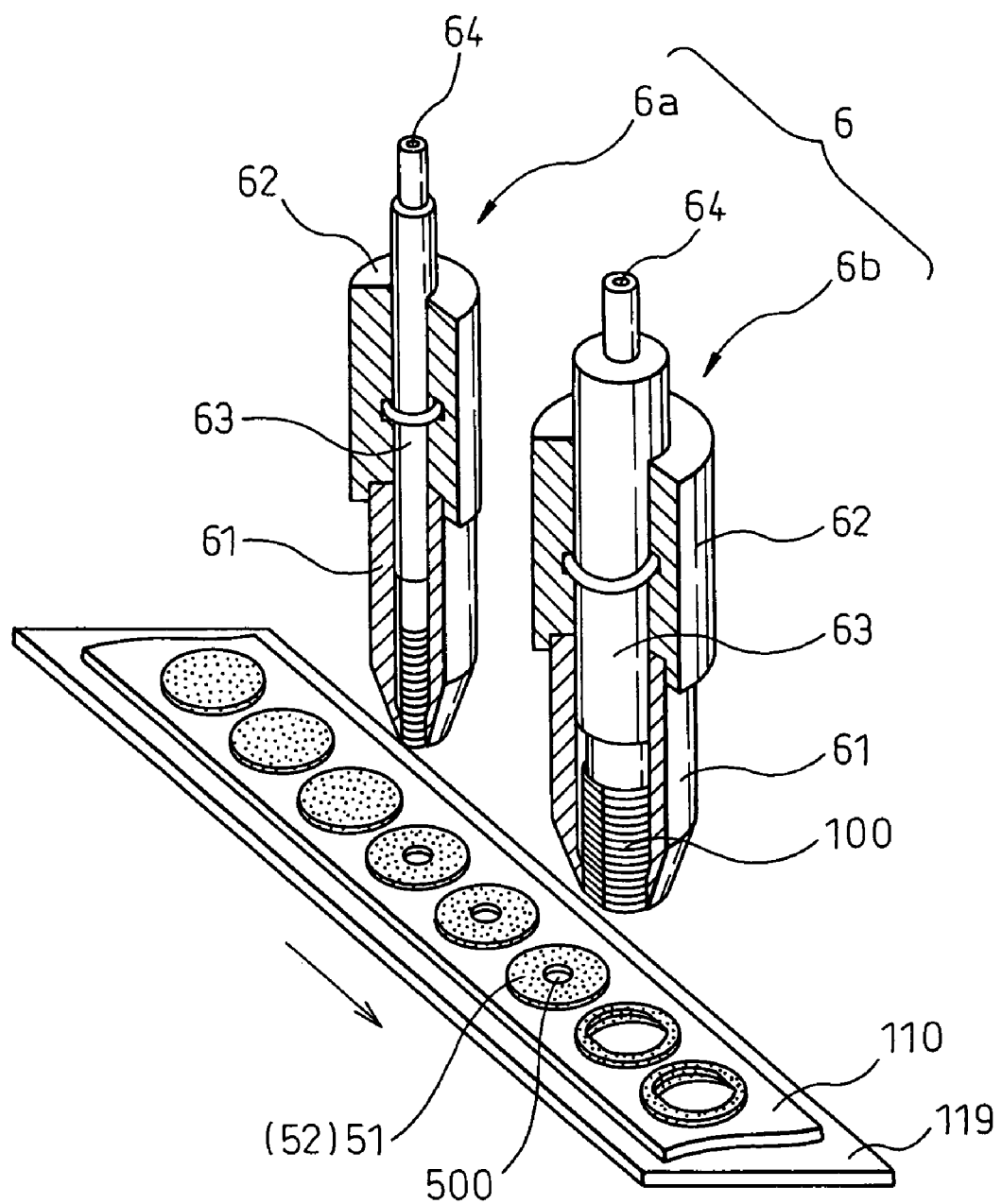
FIG. 8 is an explanatory diagram of a punching step and a laminating step carried out by a punch laminating device according to example 1.

Next, as shown in FIG. 8, a punch laminating device 6 that can simultaneously carry out the punching step and the laminating step is used to punch and laminate the sheets in parallel. In the present embodiment, a punch laminating device 6a that punches and removes the center through-hole area 42 and a punch laminating device 6b that punches and laminates the punching area 41 are used.

The punch laminating devices 6a and 6b have similar structures, and have a punch type 61 having a Thomson blade in a shape of a sheet piece to be punched, and a punch-type holder 62 that holds the punch type 61. The punch laminating devices 6a and 6b have an internally hollow structure, and incorporate a laminate holder 63 that holds a laminate obtained by laminating the punched sheet pieces. The laminate holder 63 has a suction opening 64 that passes through the inside of the laminate holder 63. The laminate holder 63 can hold the laminate by aspirating air from the suction opening 64.

The punching step and the laminating step using the punch laminating step are explained next.

First, as shown in FIG. 8, a carrier film 119 and a green sheet 110 are set together on the punch laminating device 6. The punch laminating device 6a is used to punch the center through-hole area 42 from the green sheet 110. Further, the punch laminating device 6b is used to punch the punching area 41, thereby obtaining the electrode material-containing piece 51 and the vanishing slit layer-containing piece 52. The electrode material-containing pieces 51 and the vanishing slit layer-containing pieces 52 are alternately laminated by arranging the through holes 500 of both pieces, thereby forming the intermediate laminate 100.

Figure 9:
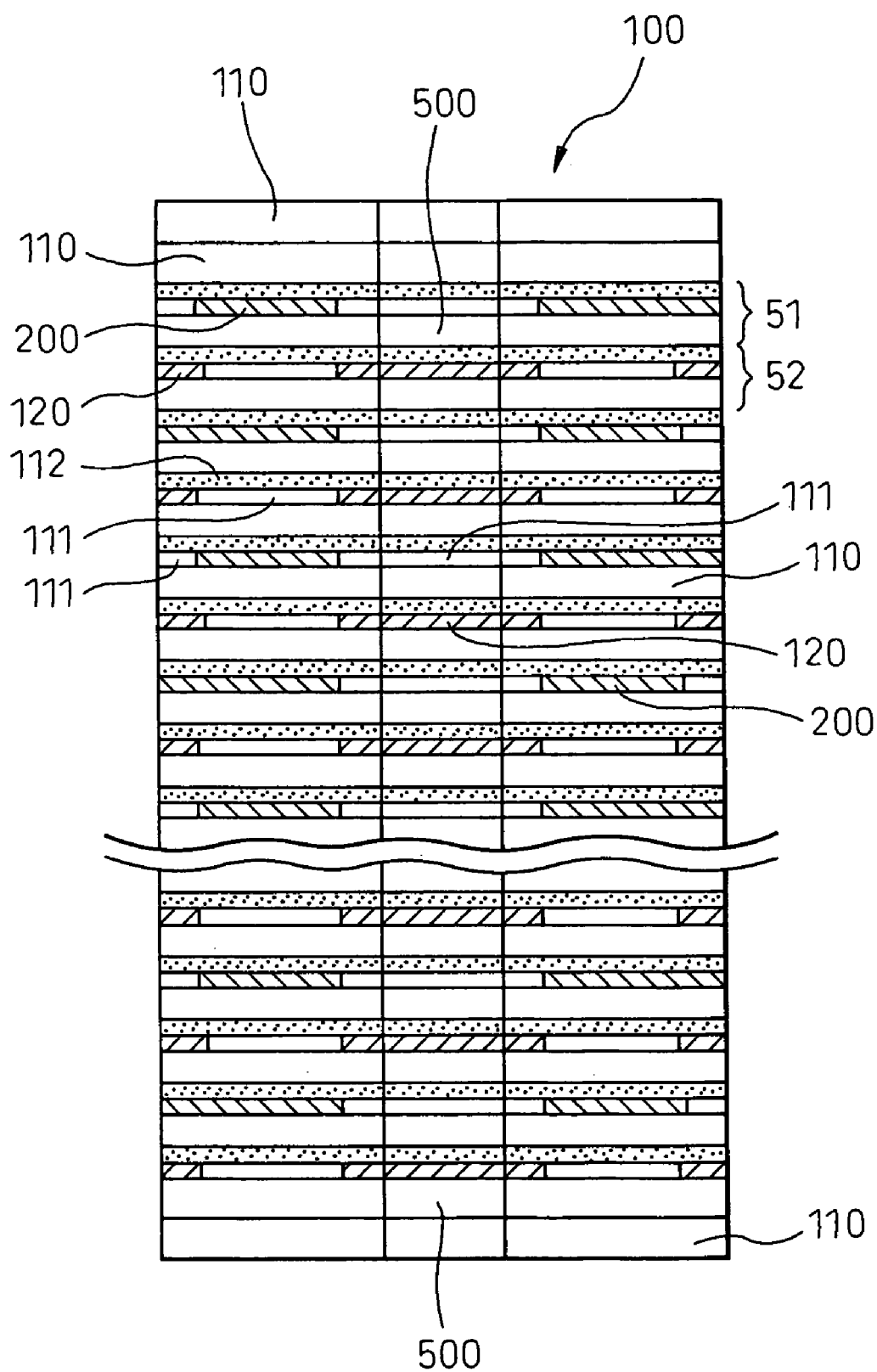
FIG. 9 is an explanatory diagram of a cross-section of an intermediate laminate according to example 1.

As explained above, the intermediate laminate 100 is formed by alternately laminating the electrode material-containing pieces 51 and the vanishing slit layer-containing pieces 52, as shown in FIG. 9. The green sheets 110 that become protection layers are laminated on the upper and lower ends of the intermediate laminate 100. The formed intermediate laminate 100 is held by being pressed in the lamination direction.

Sintering Step

Figure 10:
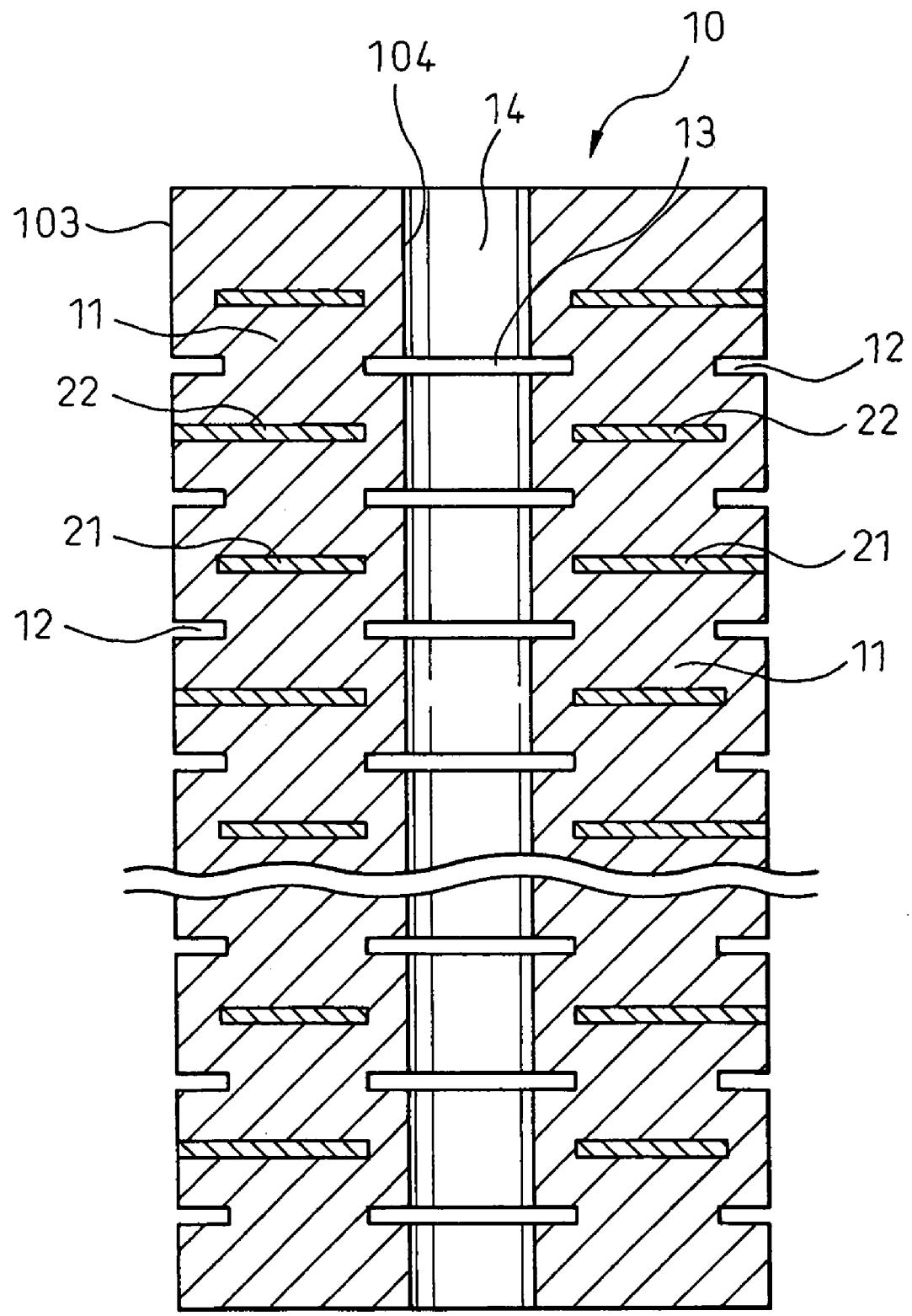
FIG. 10 is an explanatory diagram of a cross-section of a ceramic laminate according to example 1.

As shown in FIG. 10, the intermediate laminate 100 is sintered using a sintering furnace, thereby forming the ceramic laminate 10. By this sintering, the vanishing slit layers 120 are removed, and the inside peripheral slits 13 and the outside peripheral slits 12 are formed. The electrode material 200 is used to form the internal electrode layers 21, 22. The green sheets 100, the spacer layers 111, and the adhesive layers 112 form the piezoelectric layers 11.

At the sintering step, the furnace temperature of the sintering furnace is increased up to 1,050° C. as the sintering temperature over 15 hours. After the sintering temperature is held at 1,050° C. for two hours, the furnace temperature is decreased. By controlling the furnace temperature in the above manner, the vanishing slit layers 120 are removed, and the inside peripheral slits 13 and the outside peripheral slits 12 are formed in high shape precision.

Figure 11:
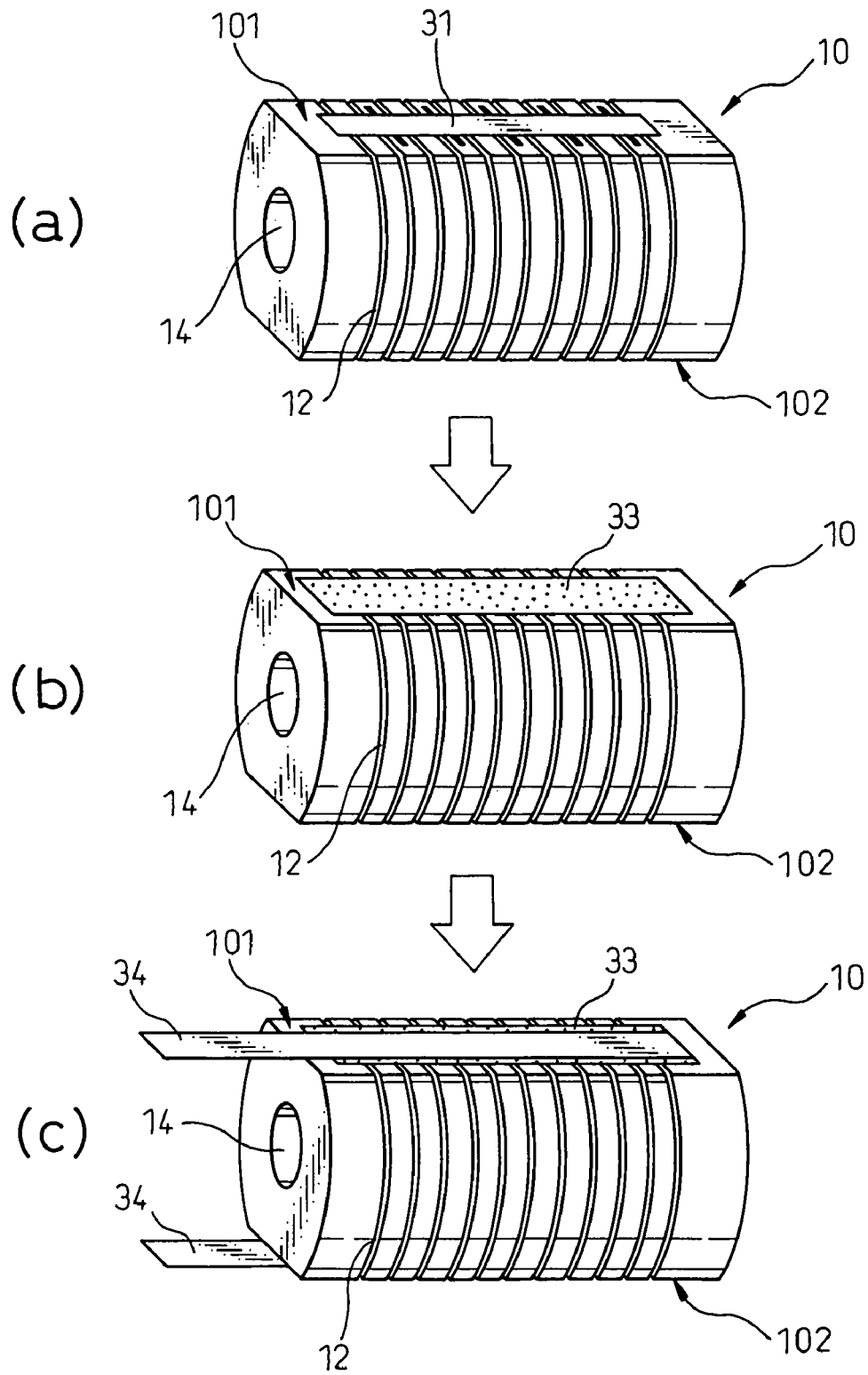
FIG. 11 is (a) an explanatory diagram of a layout of a side-surface electrode, (b) an explanatory diagram of a coating of a conductive adhesive, and (c) an explanatory diagram of a connection of a fetch electrode according to example 1.

According to the present embodiment, before the sintering step, an Ag/Pd alloy paste having conductivity, for the side electrodes, is coated on the side surfaces of the intermediate laminate 100. With this arrangement, as shown in FIG. 11(*a*), after the sintering step, the ceramic laminate 10 is manufactured, and a pair of side electrodes 31 and 32 are formed on the side surfaces 101 and 102.

After the sintering step, as shown in FIG. 11(b), the conductive adhesive 33 is coated on the side electrodes 31 and 32 that are provided on the side surfaces 101 and 102 of the ceramic laminate 10. As shown in FIG. 11(c), electrodes 34 are disposed on the conductive adhesive 33. The conductive adhesive 33 is heated and cured, thereby connecting the fetch electrodes 34 to the side surfaces 101 and 102. The whole periphery of the side surfaces of the ceramic laminate 10 is molded with the molding material 35 made of a silicon resin as an insulating resin, thereby completing the hollow laminated piezoelectric element 1.

In the present embodiment, an epoxy resin as an insulating resin dispersed with Ag as a conductive filler is used for the conductive adhesive 33. For the insulating resin, various kinds of resins such as silicone, urethane, and polyimide can be also used in addition to the above epoxy resin. For the conductive filler, Cu and Ni can be also used in addition to Ag.

For the electrodes 34, a meshed expander metal obtained by processing a metal plate is used. In addition to the above material, a punching metal and the like can be also used for the electrodes 34.

The effect of the hollow laminated piezoelectric element 1 according to the present embodiment is explained next.

In the hollow laminated piezoelectric element 1 according to the present embodiment, the ceramic laminate 10 has the internally terminated in the inside periphery that has at least a portion of the inside peripheral ends of the internal electrode layers 21 and 22 terminated within the ceramic laminate 10.

In other words, by having the inside peripheral ends of the internal electrode layers 21 and 22 terminated within the ceramic laminate 10, electric insulation can be secured on the inside peripheral surface 104 of the ceramic laminate 10. Therefore, insulation can be secured easily on the inside peripheral ends on which it has been difficult to secure insulation.

The inside peripheral surface 104 of the ceramic laminate 10 has the inside peripheral slits 13 having trenches provided in the peripheral direction toward the inside of the piezoelectric layers 11 from the inside peripheral surface 104.

In other words, because the ceramic laminate 10 has the inside peripheral slits 13, stress generated due to piezoelectric displacement can be relaxed. Therefore, the ceramic laminate 10 can suppress cracks that occur in the piezoelectric layers 11, and can improve durability. Consequently, sufficient durability can be exhibited and high reliability can be obtained even when the piezoelectric actuator is driven to obtain a higher output than a conventional output level.

As explained above, the ceramic laminate 10 can sufficiently secure electric insulation and can obtain high durability and reliability. The hollow laminated piezoelectric element 1 having this ceramic laminate 10 achieves high performance capable of obtaining a high output.

In the present embodiment, the ceramic laminate 10 has the entirely internally terminated structure in the inside periphery having all of the inside peripheral ends of all of the internal electrode layers 21 and 22 terminated within the ceramic laminate 10 so that all of the inside peripheral ends of all of the whole internal electrode layers 21 and 22 are not exposed to the inside peripheral surface 104 of the ceramic laminate 10. Therefore, electric insulation can be secured on the whole inside peripheral surface 104 of the ceramic laminate 10.

The ceramic laminate 10 also has an internally terminated structure in the outside periphery. Therefore, electric insulation can be secured on the outside peripheral surface 103 of the ceramic laminate 10.

The outside peripheral surface 103 of the ceramic laminate 10 has the outside peripheral slits 12. In other words, the ceramic laminate 10 has the slits on both the inside peripheral surface 104 and the outside peripheral surface 103. Therefore, in the whole ceramic laminate 10, the peripheral slits can sufficiently relax stress generated due to piezoelectric displacement and can further suppress the occurrence of cracks.

The inside peripheral slits 13 and the outside peripheral slits 12 have a ring shape extending in the whole peripheral directions. Therefore, both peripheral slits can sufficiently relax stress generated due to piezoelectric displacement and can further suppress the occurrence of cracks.

A pair of side electrodes 31 and 32 that are electrically connected to the internal electrode layers 21 and 22 are disposed on the side surfaces 101 and 102 of the outside peripheral surface 103 of the ceramic laminate 10. Therefore, electric conductivity of the internal electrode layers 21 and 22 and the fetch electrode 34 can be improved via the side electrodes 31 and 32.

According to the manufacturing method in the present embodiment, the spacer layers 111 are formed at the spacer layer forming step. At the subsequent laminating step, the electrode material-containing piece 51 and the vanishing slit layer-containing piece 52 can be laminated in high precision. By forming the spacer layers 111, the inside peripheral ends and the outside peripheral ends of the internal electrode layers 21 and 22 can be terminated within the ceramic laminate 10 without carrying out the step of strongly pressing in the laminate state.

At the adhesive layer forming step, the adhesive layer 112 is formed on the electrode material 200 and the spacer layer 111, and on the vanishing slit layer 120 and the spacer layer 111. In other words, the adhesive layer 112 is formed on both the electrode material-containing piece 51 and the vanishing slit layer-containing piece 52 that are obtained at the punching step. Therefore, both layers can be laminated easily at the laminating step.

As explained above, according to the present embodiment, it is possible to provide a hollow laminated piezoelectric element having excellent durability and reliability and capable of obtaining a high output, and a method of manufacturing the hollow laminated piezoelectric element.

In the present embodiment, while the inside peripheral slits 13 and the outside peripheral slits 12 are provided at the intermediate part in the lamination direction of all the adjacent internal electrode layers 21 and 22, the inside peripheral slits 13 and the outside peripheral slits 12 can be also provided along all of the internal electrode layers 21 and 22. Alternatively, both peripheral slits can be provided at every one or plural layers, and can take various shapes and can be disposed at various positions.

In manufacturing the ceramic laminate 10, layers are laminated in the state of a green sheet, and the laminate is sintered together. Alternatively, after the piezoelectric unit is sintered, this can be connected with an adhesive, thereby forming the laminate. Various other methods can be also employed.

Example 2

According to example 2, the side electrodes 31 and 32 are disposed on the inside peripheral surface 104 of the ceramic laminate 10 of example 1.

Figure 12:
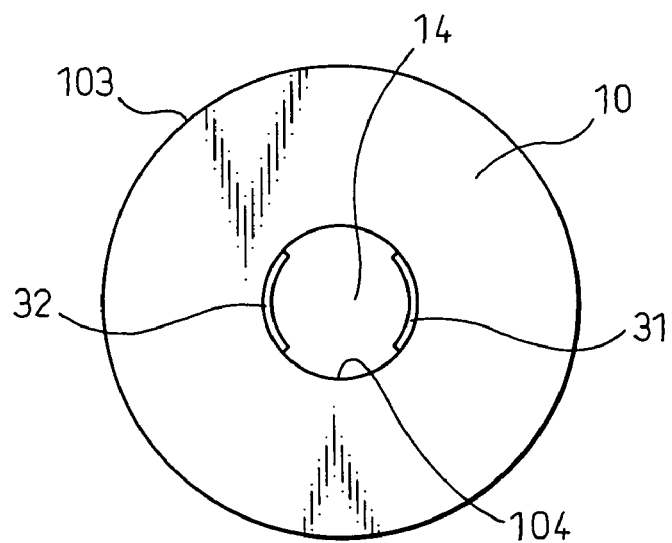
FIG. 12 is an explanatory diagram of the upper surface of a ceramic laminate having side-surface electrodes provided on the internal peripheral surface according to example 2.
Figure 13:
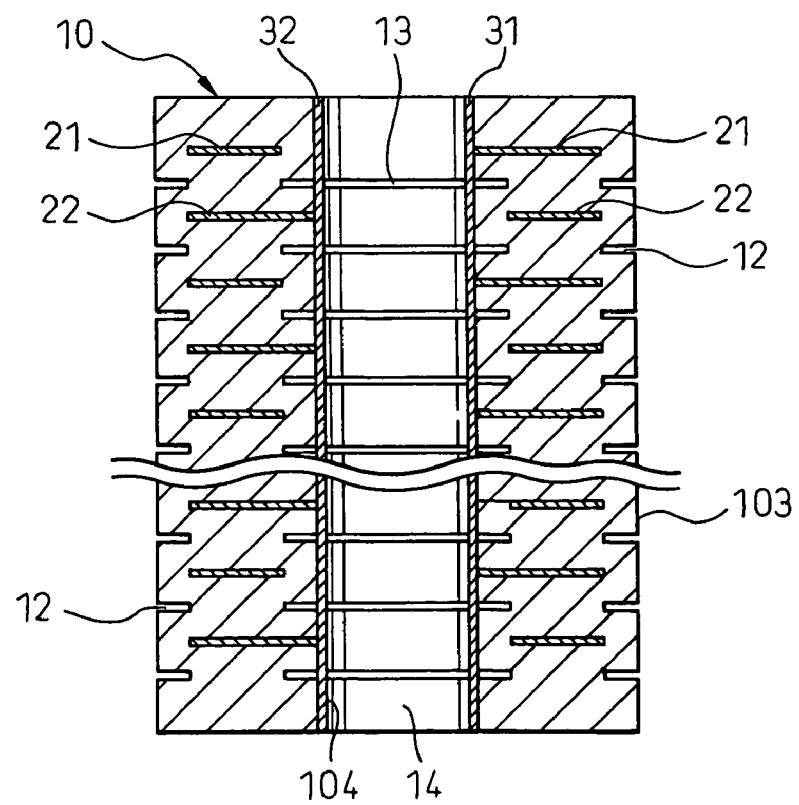
FIG. 13 is an explanatory diagram of a cross-section of a ceramic laminate having side electrodes provided on the inside peripheral surface according to example 2.

As shown in FIG. 12 and FIG. 13, according to this example, a portion of the internal electrode layers 21 and 22 are exposed to the inside peripheral surface 104 of the ceramic laminate 10. At the same time, a pair of the side electrodes 31 and 32 that are electrically connected to the internal electrode layers 21 and 22 are disposed on the inside peripheral surface 104.

The ceramic laminate 10 has an entirely internally terminated structure in the outside periphery having all of the outside peripheral ends of all of the internal electrode layers 21 and 22 terminated within the ceramic laminate 10.

Other configurations are the same as those according to example 1.

In this case, by fitting the fetch electrodes 34 and the like used in example 1 to the side electrodes 31 and 32 disposed on the inside peripheral surface 104 of the ceramic laminate 10, a hollow laminate piezoelectric element similar to the hollow laminate piezoelectric element 1 according to example 1 can be manufactured.

According to this example, because the ceramic laminate 10 has the entirely internally terminated structure in the outside periphery, electric insulation can be secured on the whole outside peripheral surface 103 of the ceramic laminate 10. Therefore, a step of securing electric insulation on the outside peripheral surface 103 is not necessary.

Other work effects are similar to those obtained from the first embodiment.

Example 3

According to this example, layout positions and shapes of the internal electrode layers 21 and 22, the inside peripheral slits 13, and the outside peripheral slits 12 of the ceramic laminate 10 in example 1 are changed. The contents are explained below with reference to FIG. 14 to FIG. 18.

Layout positions and shapes of the internal electrode layers 21 and 22, the inside peripheral slits 13, and the outside peripheral slits 12 can be changed variously by changing the print positions of the electrode material 200, the spacer layers 111 and the vanishing slit layers 120 on the green sheet 110.

Figure 14:
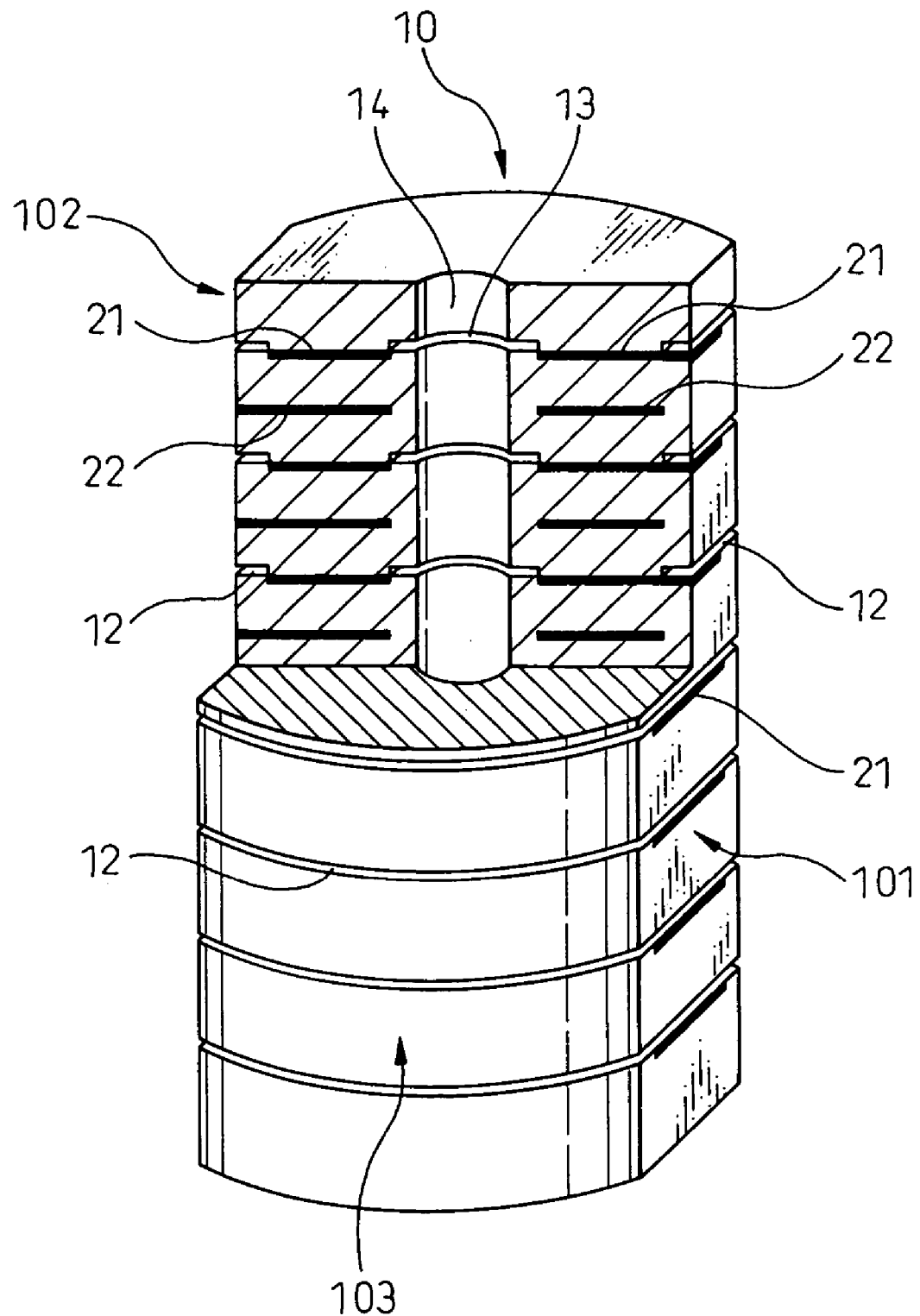
FIG. 14 is an explanatory diagram of another configuration of a ceramic laminate according to example 3.
Figure 15:
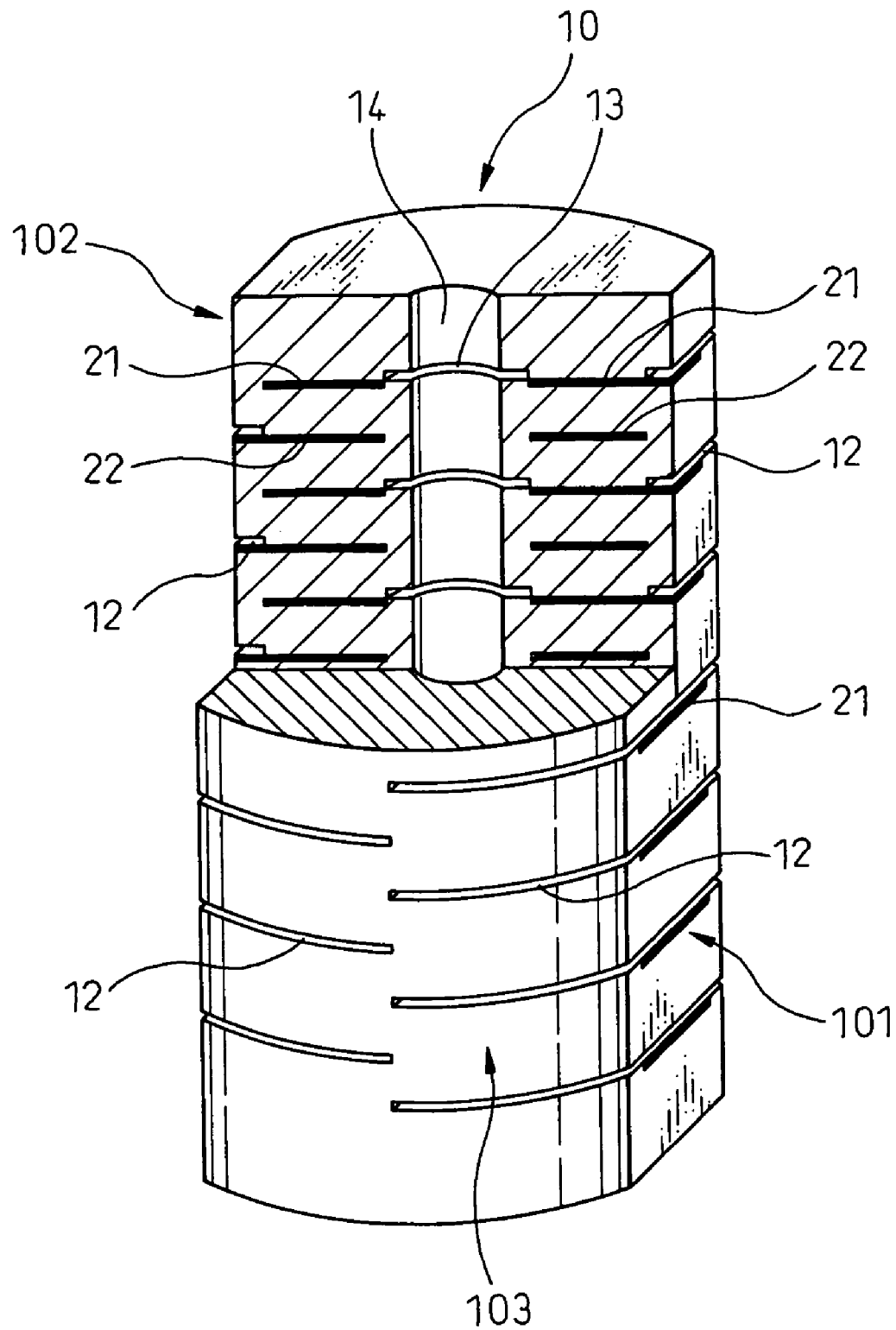
FIG. 15 is an explanatory diagram of another configuration of a ceramic laminate according to example 3.
Figure 16:
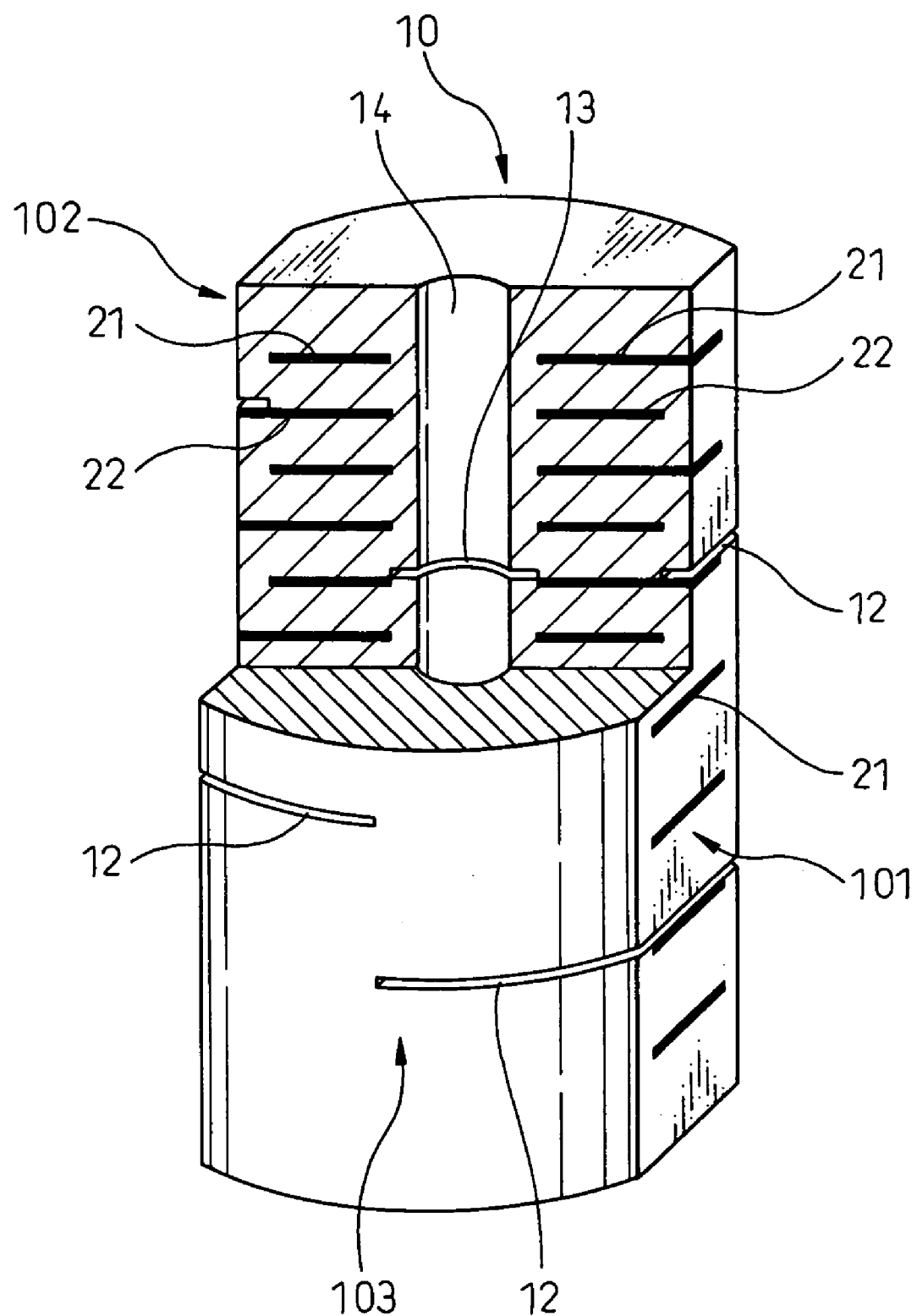
FIG. 16 is an explanatory diagram of another configuration of a ceramic laminate according to example 3.

FIGS. 14 to 16 are explanatory diagrams of the formation of the inside peripheral slits 13 and the outside peripheral slits 12 along the internal electrode layers 21 and 22, in the ceramic laminate 10 according to example 1.

The inside peripheral slits 13 can be formed along all of the internal electrode layers 21 and 22. Alternatively, the outside peripheral slits 13 can be formed along the internal electrode layers 21 and 22 at every one layer (FIG. 14 and FIG. 15) or once every several layers (FIG. 16).

The outside peripheral slits 12 can be formed along all of the internal electrode layers 21 and 22. Alternatively, the outside peripheral slits 12 can be formed along the internal electrode layers 21 and 22 at every one layer (FIG. 14 and FIG. 15) or at every plural layers (FIG. 16). The outside peripheral slits 12 can be also formed alternately by a half round on both side surfaces of the outside peripheral surface 103.

Figure 17:
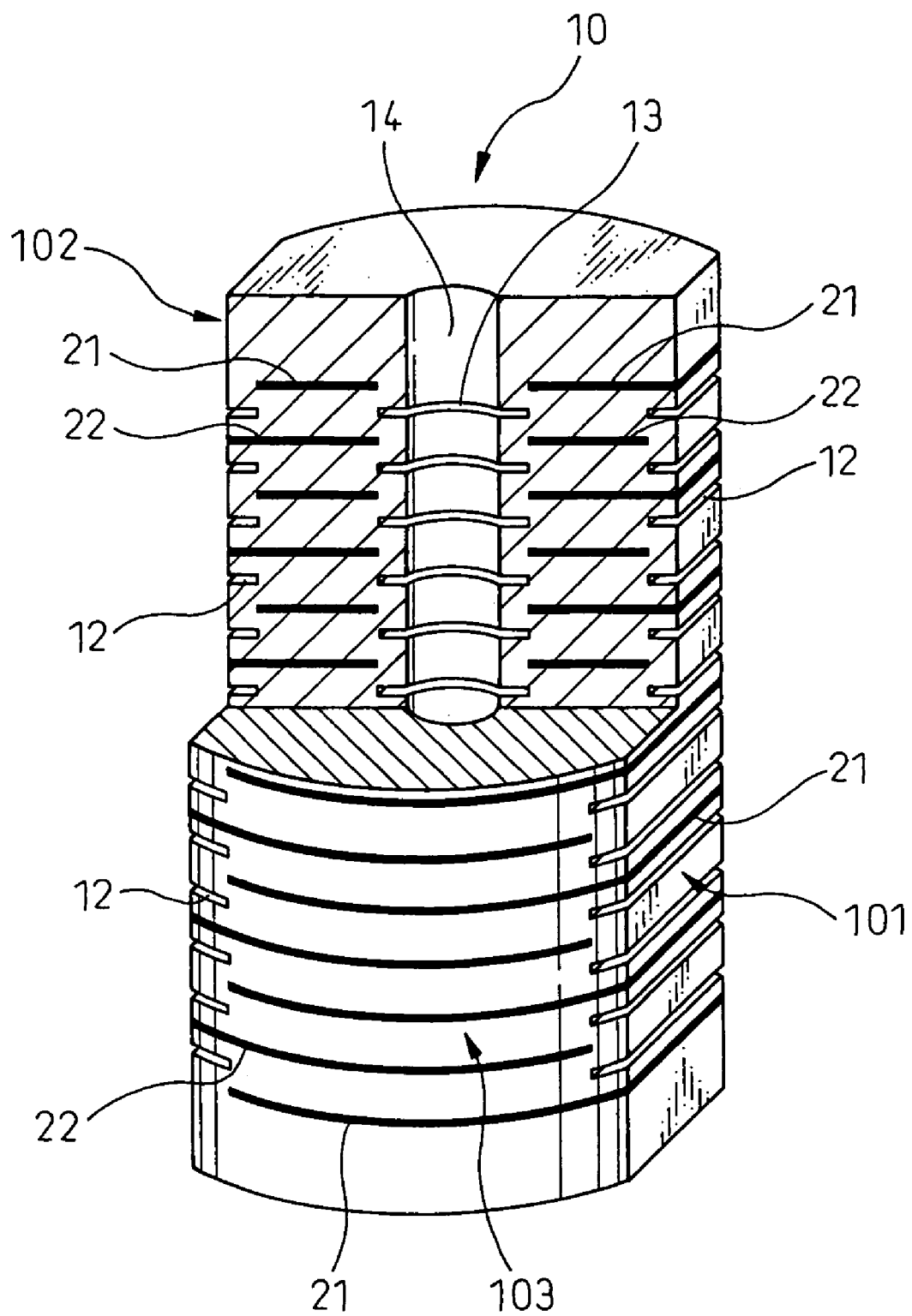
FIG. 17 is an explanatory diagram of another configuration of a ceramic laminate according to example 3.
Figure 18:
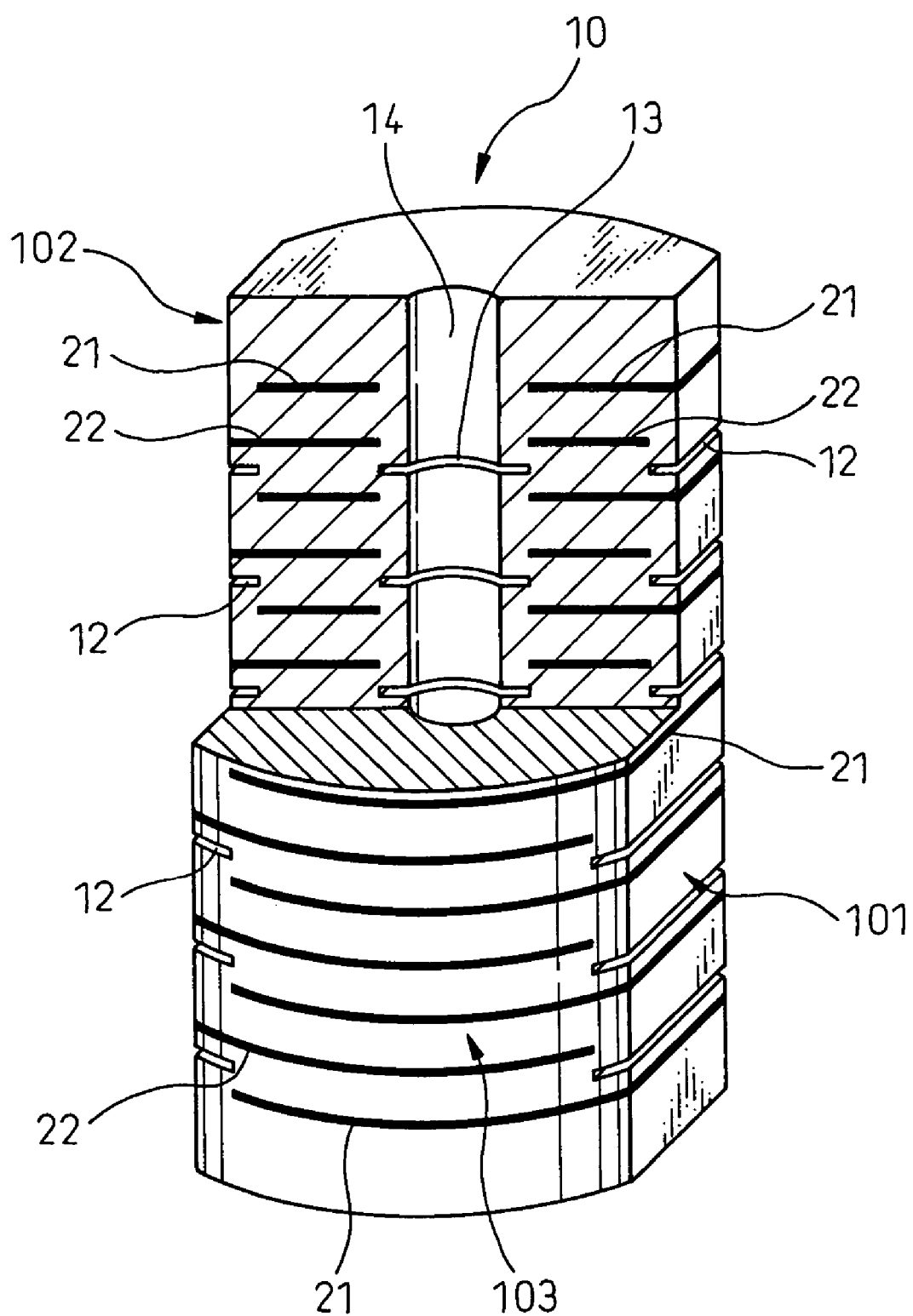
FIG. 18 is an explanatory diagram of another configuration of a ceramic laminate according to example 3.

FIG. 17 and FIG. 18 are explanatory diagrams of the whole surface electrode structure that has the internal electrode layers 21 and 22 exposed to the whole outside peripheral surface 103, in the ceramic laminate 10 according to example 1.

The inside peripheral slits 13 can be formed at the intermediate part of all of the adjacent internal electrode layers 21 and 22 as shown in FIG. 2 in example 1 (FIG. 17). Alternatively, the inside peripheral slits 13 can be formed at the intermediate part of the internal electrode layers 21 and 22 adjacently formed at every one layer (FIG. 18) or at every plural layers.

The outside peripheral slits 12 can be formed at the intermediate part of all of the adjacent internal electrode layers 21 and 22 as shown in FIG. 2 in the first embodiment (FIG. 17). Alternatively, the outside peripheral slits 12 can be formed at the intermediate part of the internal electrode layers 21 and 22 adjacently formed at every one layer (FIG. 18) or at every plural layers.

The outside peripheral slits 12 can be also formed on the whole outside peripheral surface 103 as shown in FIG. 2 in example 1, or can be formed on a part of the outside peripheral surface 103, such as the side surfaces 101 and 102 as shown in FIG. 17 and FIG. 18.

When the inside peripheral slits 13 and the outside peripheral slits 12 are disposed with a small interval, the effect of relaxing stress generated due to piezoelectric displacement can be improved. When the inside peripheral slits 13 and the outside peripheral slits 12 are disposed with a larger interval, shape precision and strength of the ceramic laminate 10 can be improved.

The other effects are similar to those obtained from the first embodiment.

Example 4

According to this example, the inside peripheral slits 13 and the outside peripheral slits 12 of the ceramic laminate 10 in example 1 are made of a porous ceramic material.

Figure 19:
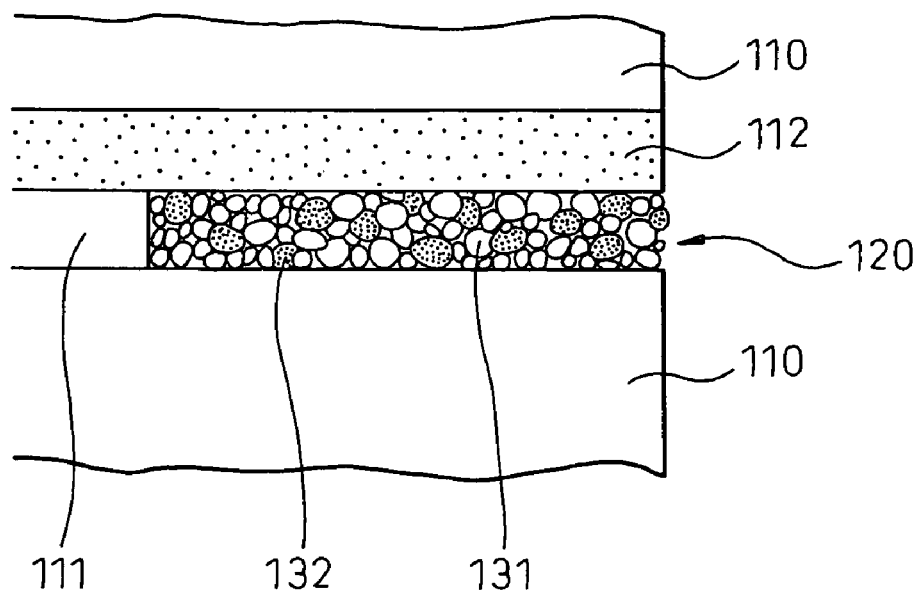
FIG. 19 is an explanatory diagram of a configuration of the periphery of a vanishing slit layer of an intermediate laminate according to example 4.
Figure 20:
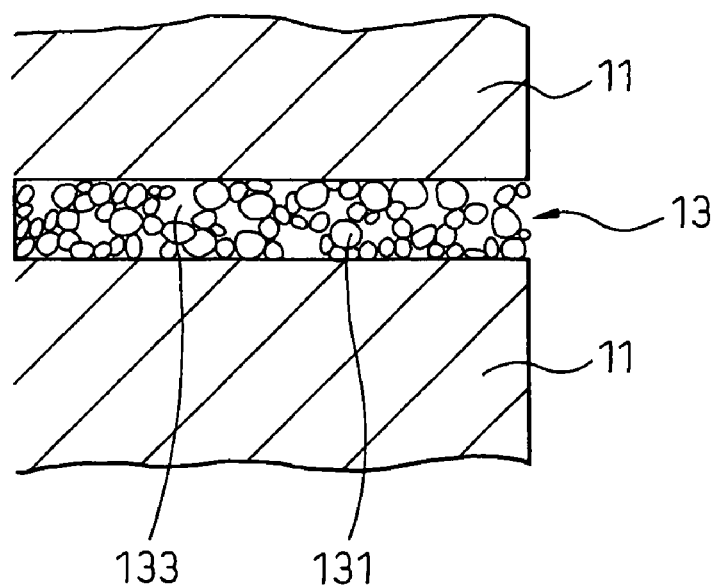
FIG. 20 is an explanatory diagram of a configuration of the periphery of an inside peripheral slit of a ceramic laminate according to example 4.

FIG. 19 is an enlarged cross-sectional configuration of the periphery of the vanishing slit layer 120 that faces the through hole 500 in the intermediate laminate 100. FIG. 20 is an enlarged cross-sectional configuration of the periphery of the inside peripheral slit 13 of the ceramic laminate 10.

Although not shown in the drawings, the vanishing slit layer 120 on the outside peripheral surface side of the intermediate laminate 100 and the outside peripheral slit 12 of the ceramic laminate 10 have configurations similar to those shown in FIG. 19 and FIG. 20.

As shown in FIG. 19, in the present embodiment, the vanishing slit layer 120 is made of a porous ceramic material prepared by dispersing carbon particles 132 as a vanishing material in the slurry made of piezoelectric particles 131 as a piezoelectric material, in place of the vanishing material that constitutes the vanishing slit layer 120.

The carbon particles 132 have an average particle diameter of 3 μm which is about six times the average particle size of the piezoelectric particles 131 that constitute the slurry are used for the vanishing material. The carbon particles 132 are mixed at about 25 percent in volume of the total porous ceramic material.

Other configurations are similar to those in the first embodiment.

As shown in FIG. 20, the ceramic laminate 10 is manufactured by sintering the intermediate laminate 100 having the vanishing slit layer 120. In this ceramic laminate 10, the inside peripheral slit 13 having many vanishing holes 133 is formed. The vanishing holes 133 are formed when the carbon particles 132 are removed in the piezoelectric particles 131 that remain after the sintering. As a result, rigidity of the inside peripheral slit 13 can be made smaller than that of the dense piezoelectric layer 11.

When the porous ceramic material is used, the piezoelectric particles 31 that remain after sintering can maintain a high-precision shape of the part that becomes the inside peripheral slit 13, and can have the total shape of the ceramic laminate 10 in high precision. In the ceramic laminate 10, the inside peripheral slit 13 becomes the part that can exhibit proper flexibility based on the porous structure.

The outside peripheral slit 12 that is formed using the porous ceramic material also has work effect similar to that of the inside peripheral slit 13.

As described above, the ceramic laminate 10 according to the present embodiment has excellent shape precision, and can relax the stress generated by piezoelectric displacement. The hollow laminated piezoelectric element 1 manufactured using this ceramic laminate 10 has excellent characteristics.

Other configurations are similar to those in the first embodiment.

In this example, the average particle diameter of the carbon particles 132 and the like that constitutes the vanishing material is at least two times of the average particle diameter of the piezoelectric particles 131. Preferably, the average particle diameter is 20 µm or below. In this case, holes having a proper size can be formed in the porous ceramic material. Consequently, both of shape precision and strength of the inside peripheral slit 13 and the outside peripheral slit 12 that are formed can be satisfied.

Preferably, the proportion of the vanishing material in the entire porous ceramic material is 10 to 40 percent in volume. In this case, shape precision of the inside peripheral slit 13 and the outside peripheral slit 12 can be increased, and strength can be secured.

More preferably, the proportion of the vanishing material in the entire porous ceramic material is 10 to 30 percent in volume. In this case, shape precision strength can be secured sufficiently.

Example 5

Figure 21:
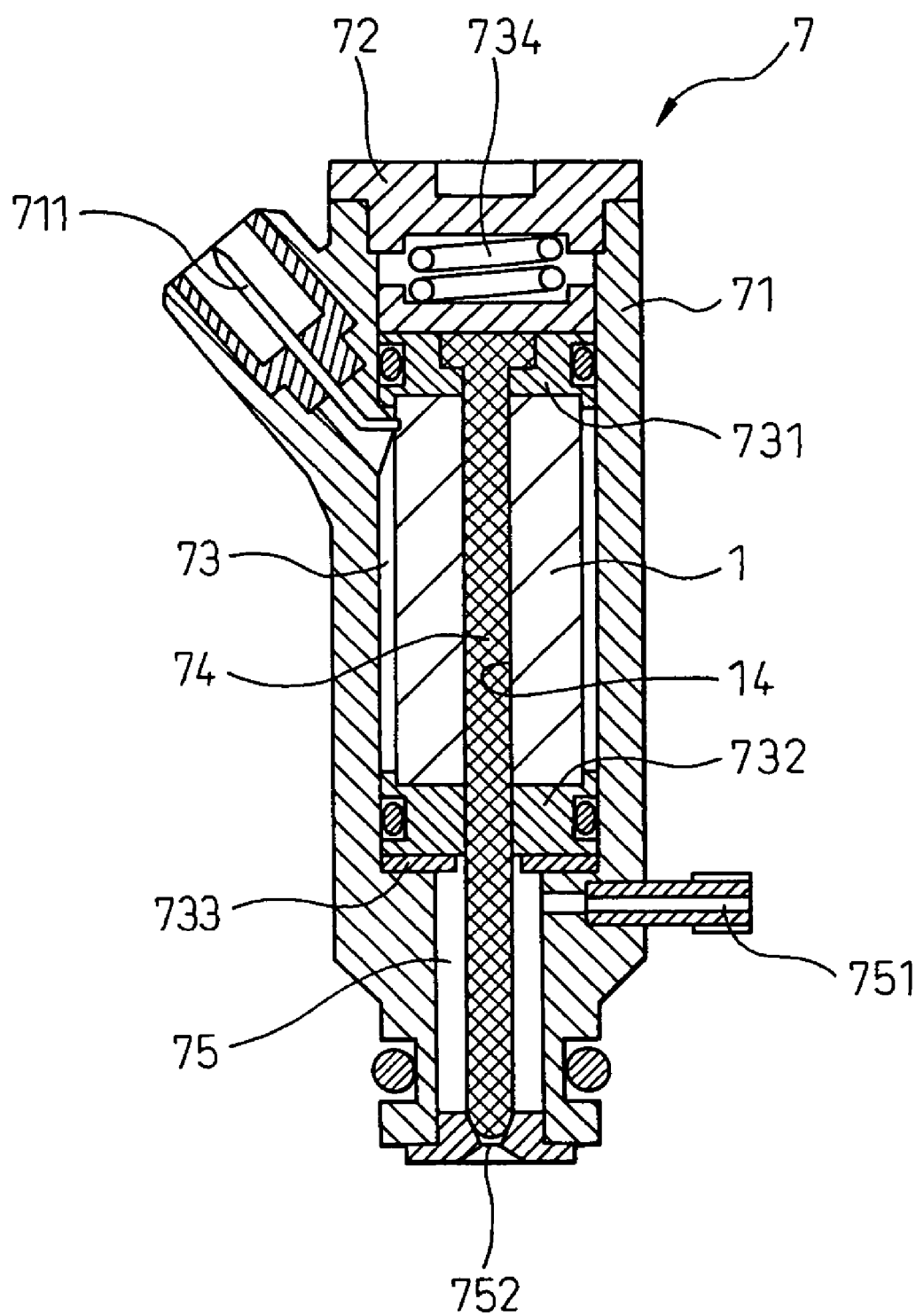
FIG. 21 is an explanatory diagram of a configuration of an injector according to example 5.

According to this example, the hollow laminated piezoelectric element 1 in example 1 is used for a piezoelectric actuator of an injector 7 as shown in FIG. 21.

The injector 7 according to this example is applied to a fuel injection valve of the engine as shown in FIG. 21.

As shown in FIG. 21, the injector 7 has a housing 71 that accommodates the hollow laminated piezoelectric element 1 as a driving unit, and a cover 72 that covers the opening at the upper end of the housing 71.

The housing 71 has approximately a cylindrical shape, and has a vertical hole 73 formed inside the housing. Inside the vertical hole 73, the hollow laminated piezoelectric element 1 is held by an upper-end holding spacer 731 and a lower-end holding spacer 732 that are provided at the upper and lower ends. An adjusting bush 733 is provided to fill a gap between the lower-end holding spacer 732 and the vertical hole 73. A needle 74 is passed through the center through hole 14 of the hollow laminated piezoelectric element 1, and is held slidably in up and down directions.

A fuel outlet pipe 711 is provided at the upper end of the housing 71, and is communicated to a fuel chamber 75 through a path not shown via a gap between the vertical hole 73 and the driving unit (i.e., the hollow laminated piezoelectric element) 1. Fuel that flows from the fuel outlet pipe 711 is returned to a fuel tank (not shown). A fuel inlet pipe 751 for introducing fuel is provided at the side of the fuel chamber 75. The fuel chamber 75 has an injection hole 752 that is opened and closed with the needle 74 and injects fuel from the fuel chamber 75.

Normally, the needle 74 holds the injection hole 752 in a valve-closed state based on force of a spring 534. However, when the driving unit 1 is driven, the driving unit 1 stretches in the up and down directions, and works on the needle 74 to move the needle 74 upward via the upper-end holding spacer 731. As a result, the injection hole 752 is opened, and fuel is injected from the fuel chamber 75.

In this example, the hollow laminated piezoelectric element 1 shown in example 1 is used for the driving source of the injector 7 having the above configuration. This hollow laminated piezoelectric element 1 has excellent durability and reliability capable of maintaining the initial performance over a long period, and can have a high output as described above. Therefore, the total performance of the injector 7 can be improved.

Example 6

Figure 22:
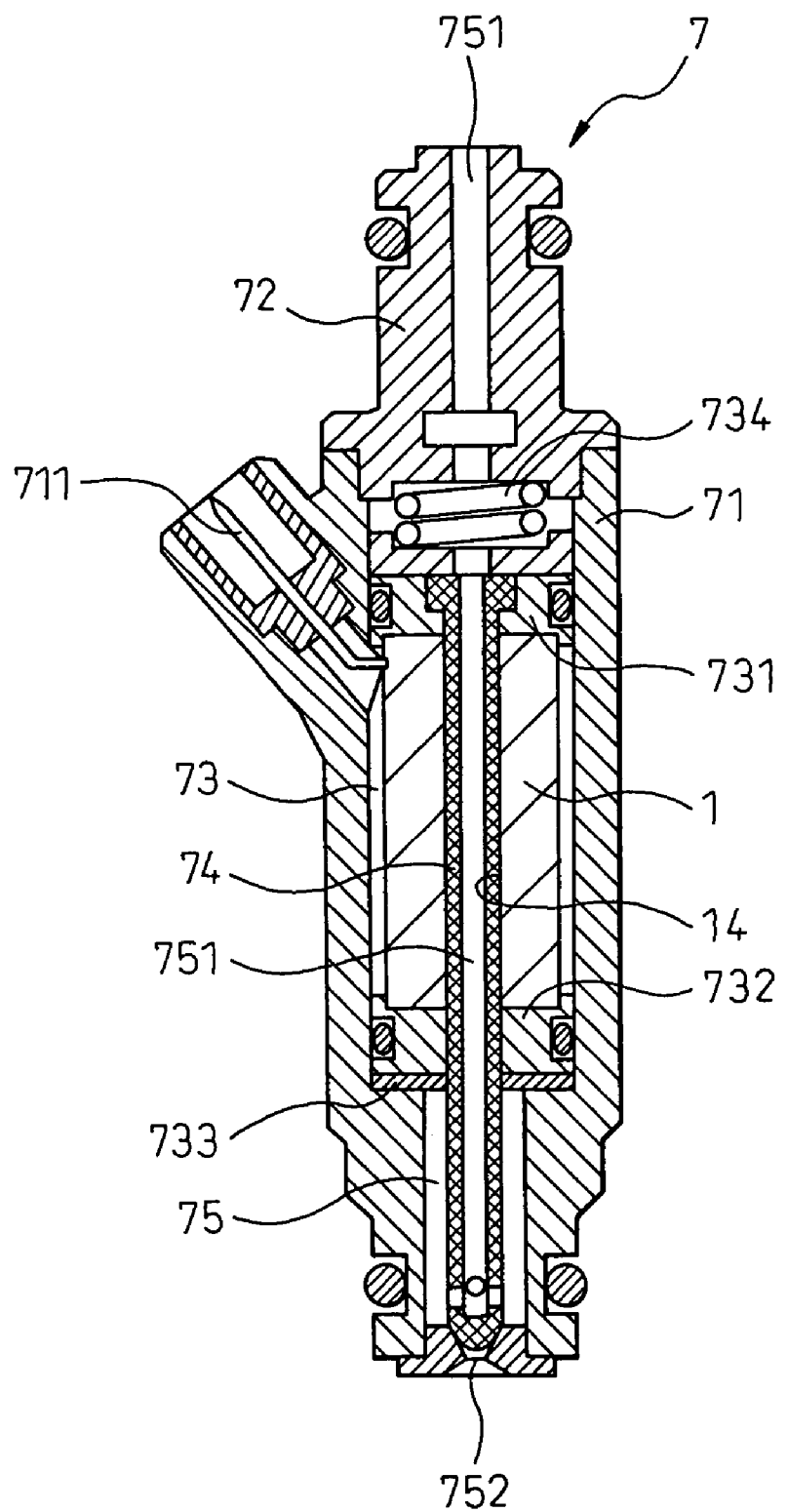
FIG. 22 is an explanatory diagram of a configuration of an injector according to example 6.

According to this example, the layout position of the fuel inlet pipe 751 in the injector 7 in example 5 is changed as shown in FIG. 22.

As shown in FIG. 22, the injector 7 according to this example has the fuel inlet pipe 751 disposed to communicate through the inside of the cover 72 and the needle 74. Fuel is introduced into the fuel chamber 75 from the needle 74.

Other configurations are similar to those in example 4, and the effect similar to that in example 4 is obtained.

What is claimed is:

1. A hollow laminated piezoelectric element comprising a ceramic laminate formed by having alternately laminated piezoelectric layers made of a piezoelectric material and internal electrode layers having conductivity and by having a center through hole formed to pass through the ceramic laminate along a lamination direction, wherein the ceramic laminate has an internally terminated structure in the inside periphery having at least a portion of inside peripheral ends of the internal electrode layers terminated within the ceramic laminate so that at least a portion of the inside peripheral ends of the internal electrode layers is not exposed to the inside peripheral surface of the ceramic laminate, and wherein the inside peripheral surface of the ceramic laminate has inside peripheral slits having trenches provided in the peripheral direction toward the inside of the piezoelectric layers from the inside peripheral surface.

2. The hollow laminated piezoelectric element according to claim 1, wherein the inside peripheral slits have a ring shape extending in the whole peripheral directions.

3. The hollow laminated piezoelectric element according to claim 1, wherein the ceramic laminate has an internally terminated structure in the outside periphery having at least a portion of outside peripheral ends of the internal electrode layers terminated within the ceramic laminate so that at least a portion of the outside peripheral ends of the internal electrode layers is not exposed to the outside peripheral surface of the ceramic laminate, and the outside peripheral surface of the ceramic laminate has outside peripheral slits having trenches provided in the peripheral direction toward the inside of the piezoelectric layers from the outside peripheral surface.

4. The hollow laminated piezoelectric element according to claim 1, wherein the ceramic laminate has an entirely internally terminated structure in the inside periphery having all of the inside peripheral ends of the internal electrode layers terminated within the ceramic laminate so that all of the inside peripheral ends of the internal electrode layers are not exposed to the inside peripheral surface of the ceramic laminate.

5. The hollow laminated piezoelectric element according to claim 1, wherein a pair of side electrodes that are electrically connected to the internal electrode layers are disposed on the outside peripheral surface of the ceramic laminate.

6. The hollow laminated piezoelectric element according to claim 1, wherein the ceramic laminate has a part of the internal electrode layers exposed to the inside peripheral surface, and a pair of side electrodes that are electrically connected to the internal electrode layers are disposed on the inside peripheral surface of the ceramic laminate.

7. The hollow laminated piezoelectric element according to claim 6, wherein the ceramic laminate has an entirely internally terminated structure in the outside periphery having all of the outside peripheral ends of the internal electrode layers terminated within the ceramic laminate so that all of the outside peripheral ends of the internal electrode layers are not exposed to the outside peripheral surface of the ceramic laminate.

8. The hollow laminated piezoelectric element according to claim 1, wherein the hollow laminated piezoelectric element is a piezoelectric actuator for an injector that is used for a driving source of an injector.

* * * * *